(12) United States Patent
Constant et al.

(10) Patent No.: US 10,741,494 B2
(45) Date of Patent: Aug. 11, 2020

(54) ELECTRONIC DEVICE INCLUDING A CONTACT STRUCTURE CONTACTING A LAYER

(71) Applicant: Semiconductor Components Industries, LLC, Phoenix, AZ (US)

(72) Inventors: Aurore Constant, Oudenaarde (BE); Peter Coppens, Kanegem (BE); Joris Baele, Ghent (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/183,078

(22) Filed: Nov. 7, 2018

(65) Prior Publication Data

US 2020/0144194 A1    May 7, 2020

(51) Int. Cl.
*H01L 23/532* (2006.01)
*H01L 21/786* (2006.01)
(Continued)

(52) U.S. Cl.
CPC .. *H01L 23/53214* (2013.01); *H01L 21/02057* (2013.01); *H01L 21/0485* (2013.01);
(Continued)

(58) Field of Classification Search
CPC ......... H01L 23/53214; H01L 23/53219; H01L 21/76886; H01L 21/28575; H01L 29/452;
(Continued)

(56) References Cited

U.S. PATENT DOCUMENTS

2002/0081800 A1   6/2002  Morita
2006/0220063 A1*  10/2006 Kurachi ............. H01L 29/7787
                                                         257/194
(Continued)

FOREIGN PATENT DOCUMENTS

EP        0323554 A1   7/1989
WO     2005008757 A1   1/2005

OTHER PUBLICATIONS

U.S. Appl. No. 15/893,328, filed Feb. 9, 2018; Coppens et al., Specification pp. 1-16, Drawing sheets 1-2.
(Continued)

*Primary Examiner* — Feifei Yeung Lopez
(74) *Attorney, Agent, or Firm* — Abel Schillinger, LLP

(57) ABSTRACT

An electronic device can include a semiconductor layer and a contact structure forming an ohmic contact with the layer. In an embodiment, the semiconductor layer can include a III-N material, and the contact structure includes a first phase and a second phase, wherein the first phase includes Al, the second phase includes a metal, and the first phase contacts the semiconductor layer. In another embodiment, the semiconductor layer can be a monocrystalline layer having a surface along a crystal plane. The contact structure can include a polycrystalline material including crystals having surfaces that contact the surface of the monocrystalline layer, wherein a lattice mismatch between the surface of the monocrystalline layer and the surfaces of the crystals is at most 20%.

20 Claims, 12 Drawing Sheets

(51) Int. Cl.

| | |
|---|---|
| *H01L 21/04* | (2006.01) |
| *H01L 21/02* | (2006.01) |
| *H01L 29/45* | (2006.01) |
| *H01L 21/285* | (2006.01) |
| *H01L 21/768* | (2006.01) |

(52) U.S. Cl.
CPC .. *H01L 21/28575* (2013.01); *H01L 21/76886* (2013.01); *H01L 21/786* (2013.01); *H01L 23/53219* (2013.01); *H01L 29/452* (2013.01); *H01L 2224/0517* (2013.01); *H01L 2224/05124* (2013.01); *H01L 2224/05166* (2013.01); *H01L 2224/05181* (2013.01)

(58) Field of Classification Search
CPC . H01L 2224/05124; H01L 2224/05166; H01L 2224/0517; H01L 2224/05181
See application file for complete search history.

(56) References Cited

U.S. PATENT DOCUMENTS

| | | | |
|---|---|---|---|
| 2007/0023777 | A1 | 2/2007 | Sonobe et al. |
| 2010/0066451 | A1 | 3/2010 | Kikkawa et al. |
| 2012/0319169 | A1* | 12/2012 | Van Hove ............. H01L 23/291 257/194 |
| 2014/0346568 | A1 | 11/2014 | De Jaeger et al. |
| 2016/0172478 | A1* | 6/2016 | Kotani .................. H01L 29/207 257/190 |
| 2018/0102416 | A1 | 4/2018 | Constant et al. |

OTHER PUBLICATIONS

Yoshida et al.; "Improvement of Au-Free, Ti/Al/W Ohmic Contact on AlGan/GaN Heterostructure Featuring a Thin-Ti Layer and Low Temperature Annealing"; Phys. Status Solidi; Wiley-VCH Verlar GmbH & Co. KGaA; 2018; pp. 1700825-1 to 1700825-5.

Lee et al.; "Au-Free AlGaN/GaN Heterostructure Field-Effect Transistor with Recessed Overhang Ohmic Contacts Using a Ti/Al Bilayer"; Semiconductor Sci. Technol.; IOP Publishing (publisher); 2015; pp. 1-7.

Huang et al.; "Au-Free Normally-Off AlGaN/GaN-on-Si MIS-HEMTs Using Combined Partially Recessed and Fluorinated Trap-Charge Gate Structures"; IEEE Electron Device Letters; vol. 35, No. 5; 2015; pp. 569-71.

Firrincieli et al.; "Au-Free Low Temperature Ohmic Contacts for AlGaN/GaN Power Devices on 200 mm Si Substrates"; Japanese Journal of Applied Physics; 2014; pp. 04EF01-1 to 04EF01-4.

Jia et al.; "AlGaN/GaN Schottky Diode Fabricated by Au Free Process"; IEEE Electron Device Letters; vol. 34, No. 10; 2013; pp. 1235-37.

Van Hove et al. "Fabrication and Performance of Au-Free AlGaN/GaN-on-Silicon Power Devices with Al2O3 and Si3N4/Al2O3 Gate Dielectrics"; IEEE Transactions on Electron Devices; vol. 60, No. 10; 2013; pp. 3071-78.

Greco et al.; "Nanoscale Structural and Electrical Evolution of Ta- and Ti-based Contacts on AGan/GaN Heterostructures"; Journal of Applied Physics; 2013; pp. 083717-1 to 08317-5.

Liu et al.; "AlGaN/AlN/GaN High-Electron-Mobility Transistors Fabricated with Au-Fee Technology"; Applied Physics Express; 2013; pp. 096502-1 to 096502-4.

De Jaeger et al.; "Au-free CMOS-compatible AlGaN/GaN HEMT Processing on 200 mm Si Substrates"; Proc.of the 24th Int'l Symposium on Power Semiconductor Devices and ICs; IEEE (publisher); 2012; pp. 49-52.

Lee et al.; AlGaN/GaN High-Electron-Mobility Transistors Fabricated Through a Au-Free Technology; IEEE Electron Device Letters; vol. 32, No. 5; 2011; pp. 623-25.

Malmros et al., "Electrical Properties, Microstructure, and Thermal Stability of Ta-based Ohmic Contacts Annealed at Low Temperature for GaN HEMTs", Semiconductor Science and Technology; 2011; pp. 1-7.

Samey et al.; "TEM Study of the Morphology of GaN/SiC (0001) Grown at Various Temperatures by MBE"; Carnegie Mellon Univ.; 2006; pp. 1 to 6.

Van Daele et al.; "The Role of Al on Ohmic Contact Formation on n-type GaN and AlGaN/GaN"; Applied Physics Letters; 2005; pp. 061905-1 to 061905-3.

Constant et al.; "Impact of Ti/Al Atomic Ratio on the Formation Mechanism of Non-recessed Au-free Ohmic Contacts on AlGaN/GaN Heterostructures"; J. Appl. Phys.; vol. 120; AIP Publishing; pp. 104502-1 to 104502-7 (2016).

Wolf, Stanley; Silicon Processing for the VLSI Era, vol. 2: Process Integration, Lattice Press, pp. 268-73 (1990).

European Patent Office, "Extended European Search Report", Application No. 19202633.4, dated Mar. 3, 2020.

* cited by examiner

ELECTRONIC DEVICE INCLUDING A CONTACT STRUCTURE CONTACTING A LAYER

FIELD OF THE DISCLOSURE

The present disclosure relates to electronic devices and processes of forming electronic devices, and more particularly to, electronic devices including contact structures contacting layers and processes of forming the same.

RELATED ART

A power transistor has relatively large current flowing through the active region of the transistor when the transistor is in the on-state. On-state resistance between a source and drain within a power transistor can result in power loss within the transistor. Contact resistance between a conductive structure (e.g., a source or drain electrode) and an underlying layer is part of the on-state resistance, and thus, lower contact resistance results in less power loss within the transistor. Many contact structures can include a bulk conductive film, such as an Al alloy, with at least one other film above or below the bulk conductive film. Such other film may be an adhesion film, a diffusion barrier film, an anti-reflective film, a protective film, or the like. Many attempts have been made to improve the conductive structure by selecting a particular order of films each having a particular composition and thickness. Even with all of the selections of the film order, composition, and thicknesses, the contact resistance may still not be low enough. Further improvement (lowering) of contact resistance is desired.

BRIEF DESCRIPTION OF THE DRAWINGS

Embodiments are illustrated by way of example and are not limited in the accompanying figures.

Figure 1:
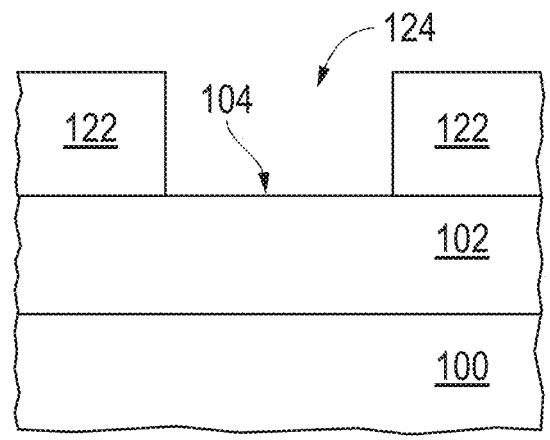
FIG. 1 includes an illustration of a cross-sectional view of a portion of a workpiece including a semiconductor layer, an insulating layer, and a contact opening extending through the insulating layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 element and at least one Group 15 element. A III-N material is intended to mean a semiconductor material that includes at least one Group 13 element and nitrogen.

The term "alloy" is intended to mean a mixture of at least two different metal elements that is substantially free (less than 0.1 weight %) of an intermetallic compound.

The term "compound" is intended to mean a molecule that includes at least two different elements.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "power transistor" is intended to mean a transistor that is designed to have a drain-to-source current (Ids) of at least 0.1 A when the transistor is in its on-state.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A contact structure can be formed that has crystals aligned to have surfaces along a crystal plane that are aligned to a surface along a crystal plane for an underlying layer that contacts the contact structure. A cleaning operation can be performed to ensure substantially all oxide and other contamination is removed before depositing any films within a conductive layer for the contact structure. The thickness of a bulk conductive film can be selected so that a particular phase, such as an Al phase, contacts the underlying layer, even if a contacting film is deposited before the bulk conductive film is deposited. A reaction between materials in the bulk conductive film itself or in combination with either or both of a contacting film and a capping film can react and form a separate phase, in addition to a principal phase, within the bulk conductive film. Although not required in all embodiments, both the principal and separate phases can contact the surface of the underlying layer. The lowest contact resistance can occur with at least some of both phases contacting the underlying layer. The concepts are better understood with the description below in conjunction with the figures.

In an aspect, an electronic device can include a layer including a III-N material and a contact structure forming an ohmic contact with the layer. The contact structure can include a first phase and a second phase different from the first phase, the first phase can include Al, the second phase can include a metal, and the first phase can contact the layer.

In another aspect, an electronic device can include a monocrystalline layer having a surface along a crystal plane and a contact structure forming an ohmic contact with the monocrystalline layer. The contact structure can include a polycrystalline material including first crystals having first surfaces that contact the surface of the monocrystalline layer, wherein a lattice mismatch between the surface of the monocrystalline layer and the first surfaces of the first crystals is at most 20%.

In a further aspect, a process of forming an electronic device can include cleaning a surface of a semiconductor layer, wherein the surface is along a crystal plane; forming a contact structure that includes Al and a metal; and annealing the layer and the contact structure. After the anneal, the contact structure can include a first phase and a second phase different from the first phase, the first phase can include Al, the second phase can include the metal, and the first phase can contact the surface of the layer.

FIG. 1 includes a cross-sectional view of a portion of a workpiece that includes a semiconductor layer 102, an insulating layer 122, and a contact opening 124 extending through the insulating layer 122. The semiconductor layer 102 may be a substrate (e.g., a semiconductor wafer, not illustrated) or a layer overlying a substrate 100 as illustrated in FIG. 1. The semiconductor layer 102 surface can include a monocrystalline material, such as Si, SiC, a III-V semiconductor material, or a II-VI semiconductor material. In an embodiment, the III-V semiconductor material can be a III-N material, such as $In_aAl_bGa_cN$, where a+b+c=1. On a relative basis, low contact resistance may be more difficult to achieve as the content of In and Al increases relative to Ga. In a further embodiment, the semiconductor layer 102 can include a double heterostructure including a combination of different III-N compounds. The concepts as described herein can be beneficial to any or all of the materials previously described with respect to layer 102.

The insulating layer 122 can include a single film or a plurality of films. The single film or each of the films can include an oxide, a nitride, or an oxynitride. In an embodiment, the insulating layer 122 can have a thickness in a range from 20 nm to 2000 nm. In a particular embodiment, the insulating layer 122 can be an interlevel dielectric (ILD) layer.

A masking layer (not illustrated) can be formed over the insulating layer 122. The insulating layer 122 can be patterned to define the contact opening 124 that extends though the insulating layer 122 and expose a surface 104 of the semiconductor layer 102 along the bottom of the contact opening 124. Some or all of the semiconductor layer 102 is also removed. When all of the semiconductor layer 102 underlying the contact opening 124 is removed, an underlying semiconductor layer (not illustrated) may become exposed. As illustrated in FIG. 1, none or very little of the semiconductor layer 102 is removed within the contact opening 124. The surface 104 of the semiconductor layer 102 may lie along a crystal plane. For example, Si has a cubic lattice structure, and the surface 104 may lie along a (100) or a (111) crystal plane. The interplanar spacing for Si along the (100) crystal plane is 0.543 nm, and the interplanar spacing for Si along the (111) crystal plane is 0.313 nm. $In_aAl_bGa_cN$ has a hexagonal lattice structure, and the surface 104 can lie along a (0002). In an embodiment, the interplanar spacing for AlN along the (0002) crystal plane is 0.25 nm, for GaN along the (0002) crystal plane is 0.259 nm, and for InN along the (0002) crystal plane is 0.285 nm. The interplanar spacing for ternary and quaternary compounds of $In_aAl_bGa_cN$ can be calculated for any composition within contour conditions which correspond to the different binary III-N, using Vegard's law. Other materials can have different crystal lattice structures and interplanar spacings. For 3C—GaN along the (111) crystal plane, the interplanar spacing is 0.261 nm, for 2H—GaN along the (0002) crystal plane, the interplanar spacing is 0.259 nm, for 4H—SiC along the (0004) crystal plane, the interplanar spacing is 0.251 nm, and for 6H—SiC along the (0006) crystal plane, the interplanar spacing is 0.251 nm. The significance of the interplanar spacing will become more apparent later in this specification. The masking layer can be removed after the insulating layer 122 is patterned. In a particular embodiment, the masking layer can be removed by ashing using an oxygen-containing plasma.

During patterning of the insulating layer 122 or removing the masking layer, an oxide or a contaminant may be formed along the surface 104 of the semiconductor layer 102. A cleaning operation can be performed to remove residual oxide or contaminant that may form along the surface 104. The cleaning operation may include exposing the surface 104 to a solution including HCl, HF (with or without a buffering agent, such as $NH_4F$), $(CH_3)_4NOH$ (tetramethyl ammonium hydroxide or TMAH), or the like. A series of cleaning solutions may be used. For example, an HF solution may be used to remove oxide, and an HCl solution may be used to remove metal contamination.

In another embodiment, the cleaning operation may be performed within a deposition or reaction chamber. For example, the workpiece including the semiconductor layer 102 along the bottom of the contact opening 124 is exposed to a reducing ambient. The reducing ambient can include a reducing gas, an inert gas, or a combination thereof. In a particular embodiment, the reducing ambient may include at most 4 mol % $H_2$ (lower explosion limit of $H_2$ in air) and the remainder of one or more inert gases (Ar, He, $N_2$, or the like). In another particular embodiment, the reducing ambient can include one or more inert gases at a temperature above room temperature (e.g., more than 50° C.) without a reducing agent. In another example, a plasma formed from an inert gas, such as Ar, He, or the like) can be directed as the surface 104. For example, in a sputtering tool, the plasma can be directed to the workpiece instead of the sputtering target to physically remove an oxide or another contaminant. The process may use low power to keep damage to the surface relatively low.

The inventors have discovered that a conductive structure can be formed that is favorable aligned to the surface 104 within the contact opening 124 to further reduce contact resistance. The crystal structures of the layer 102 and the conductive material can align if their lattice parameters match sufficiently close, for example, within 20%. A conductive material with a hexagonal lattice structure can have an epitaxial or fiber structure alignment with the hexagonal lattice of $In_aAl_bGa_cN$ if the lattice mismatch along the a-axis is limited, such as less than 20%. A conductive material with cubic lattices (body centered cubic (BCC), face centered cubic (FCC) or simple-cubic) can along the [110] direction form an epitaxial or fiber structure alignment with the hexagonal lattice of $In_aAl_bGa_cN$ if the lattice mismatch along the [110] direction of the cubic lattice and the a-axis of the hexagonal lattice is limited, at most 20%. In an embodiment, the a-axis for AlN has a lattice constant of 0.311 nm, for GaN the a-axis has a lattice constant of 0.318 nm, and for InN the a-axis has a lattice constant of 0.353 nm. The lattice constant along the a-axis for ternary and quaternary compounds of $In_aAl_bGa_cN$ can be calculated for any composition within contour conditions which correspond to the different binary III-N, using Vegard's law.

Below is a table for AlN, GaN and InN, as the semiconductor layer 102, and some conductive materials with respect to crystal parameters. As used herein, lattice mismatch is:

$$LM = \frac{|m*dsemi - dcond|}{m*dsemi} *100\%,$$

where

LM is the lattice mismatch (expressed as an absolute value), dsemi is the lattice constant for the semiconductor layer 102 along the surface 104, and dcond is the nearest distance between two atoms for a particular conductive material and crystal plane. In case the lattice crystal of the particular conductive material is hexagonal, dcond is the lattice constant a of the hexagonal crystal. In case the lattice crystal is cubic, dcond is the nearest distance between two atoms of the particular conductive material in the (111) crystal plane, hence along the [110] direction.

m is an integer: 1 in the case the lattice crystal of the particular conductive material is hexagonal or face-centered-cubic, 2 in the case the lattice crystal of the particular conductive material is body-centered-cubic.

TABLE 1

| | | Crystal Parameters | | | | |
|---|---|---|---|---|---|---|
| Material | Lattice structure | Lattice constant, a (nm) | Inter-atomic spacing along the [110] direction (nm) | LM (%) AlN | LM (%) GaN | LM (%) InN |
| Al | FCC | 0.405 | 0.286 | 7.9 | 9.9 | 18.9 |
| α-Ti | Hexagonal | 0.295 | N/A | 5.1 | 7.2 | 16.4 |
| β-Ti | BCC | 0.328 | 0.464 | 25.4 | 27.1 | 34.3 |
| Zr | Hexagonal | 0.323 | N/A | 3.9 | 1.6 | 8.5 |
| Hf | Hexagonal | 0.319 | N/A | 2.6 | 0.3 | 9.6 |
| V | BCC | 0.303 | 0.429 | 31.1 | 32.6 | 39.3 |
| Nb | BCC | 0.330 | 0.467 | 25.0 | 26.6 | 33.9 |
| α-Ta | BCC | 0.331 | 0.468 | 24.7 | 26.4 | 33.7 |
| fcc-Ta | FCC | 0.422 | 0.298 | 4.1 | 6.2 | 15.5 |
| Mo | BCC | 0.315 | 0.445 | 28.4 | 30.0 | 36.9 |
| α-W | BCC | 0.316 | 0.447 | 28.2 | 29.7 | 36.7 |

Lattice mismatches in Table 1 are relative to AlN, GaN, and InN along the (0002) crystal plane. A conductive material may have an epitaxial or fiber texture aligned to the surface 104 when the lattice mismatch is at most 20%. Referring to Table 1, Al, α-Ti, Zr, Hf and fcc-Ta may be aligned to $Al_zGa_{(1-z)}N$ where $0 \le z \le 1$, and β-Ti, α-Ta, V, Nb, Mo, and α-W cannot be aligned along the (111) crystal plane to $Al_zGa_{(1-z)}N$ (0002) crystal plane due to the high lattice mismatch. Alignment of Al, Ti, Zr, Hf and fcc-Ta to $In_aAl_bGa_cN$ is easier for low In content (a<0.2) because the lattice mismatch is much lower than in the case of pure InN (a=1). After reading this specification, skilled artisans will be able to determine which materials and crystal orientations have an acceptable lattice mismatch for a particular composition of the semiconductor layer 102 and the interplanar spacing along the surface 104.

The alignment of thin films, such as the layer 102 and the conductive material, is based on specific interface structures between the crystal lattices of the layer 102 and the conductive material. These interfaces are characterized by the lattice mismatch. A low lattice mismatch is expected to facilitate the formation of nearly perfect interface between the layer 102 and the conductive material. The alignment of planes in the conducting material and the layer 102 that share the same interplanar spacing is characterized by epitaxial or fiber texture.

The lattice parameters of the layer 102 and the conductive material are such that the (0002) hexagonal plane of the layer 102 is identical to the (111) FCC plane of the conductive material, both planes are hexagonal close packed, and in this particular case, the interplanar spacings are also similar.

The interplanar spacing for AlN along the (0002) crystal plane is 0.25 nm, for GaN along the (0002) crystal plane is 0.259 nm, and for InN along the (0002) crystal plane is 0.285 nm, which are very close to the interplanar spacing of Al (111) 0.233 nm or fcc-Ta (111) 0.243 nm, at most 20%. Therefore, when the layer 102 and the conductive material are joined along the hexagonal close packed planes, the resulting interface is completely coherent.

The lattice parameters of the layer 102 and the conductive material are such that (i) the (0002) hexagonal plane of the layer 102 and (ii) the (111) FCC or the (0002) hexagonal plane of the conductive material, depending on the particular conductive material, are very close, and in this particularly case, the interplanar spacings are also similar. The interplanar spacing of Ti (0002) 0.234 nm, Zr (0002) 0.257 nm, and Hf (0002) 0.253 nm are very similar to the interplanar spacings of AlN, GaN and InN, at most 20%. Therefore, when the layer 102 and the conductive material are joined along the hexagonal close packed planes, the resulting interface is completely coherent.

Figure 2:
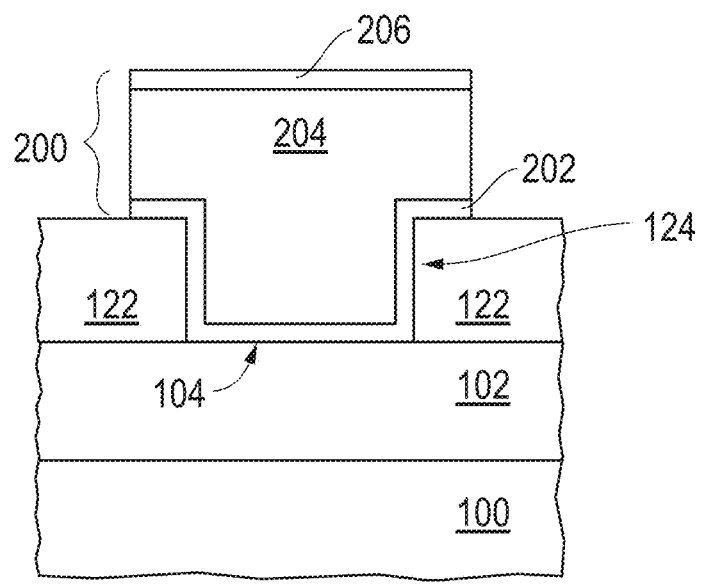
FIG. 2 includes an illustration of a cross-sectional view of the workpiece of FIG. 1 after forming a conductive layer in accordance with an embodiment.

A conductive layer is formed over the insulating layer 122 and within the contact opening 124. The conductive layer can include a single film or a plurality of films. In FIG. 2, the conductive layer 200 can include a contacting film 202, a bulk conductive film 204, and a capping film 206 that may be an anti-reflective film, a protective film, or the like. For an $Al_zGa_{(1-z)}N$ semiconductor layer 102 and the surface 104 along the (0002) crystal plane, the contacting film 202 can include Ti, Zr, Hf, or Ta.

The contacting film 202 can include a metal. The contacting film 202 can be deposited such that the (0002) crystal plane for α-Ti, Zr, or Hf or the (111) crystal plane for fcc-Ta is aligned to the surface 104 of the layer 102. As will be discussed in more detailed later in this specification, data suggest that the contacting film 202, as deposited, is aligned with epitaxial or fiber texture to the semiconductor layer 102. In an embodiment, the contacting film 202 can be formed by sputter deposition. In another embodiment, the contacting film 202 may be formed using molecular beam epitaxy or atomic layer deposition.

The bulk conductive film 204 can include Al. In an embodiment, the bulk conductive film can include at least 90 atomic % Al or at least 95 atomic % Al. The bulk conductive film may include one or more other materials, such as Cu, Si, W, or the like, and the other materials may make up at most 5 atomic % of the bulk conductive film. As compared to the (200) crystal plane of Al, the (111) crystal plane of Al has a lower lattice mismatch to the (0002) crystal plane of $Al_zGa_{(1-z)}N$ and to the (0002) crystal plane for Ti, Zr, or Hf or the (111) crystal plane for fcc-Ta, depending on the particular metal used for the contacting film 202. As will be discussed in more detailed later in this specification, data suggests that the bulk conductive film 204, as deposited, is aligned to the (0002) crystal plane of $Al_zGa_{(1-z)}N$ or to the contacting film 202. In an embodiment, the bulk conductive film 204 can be formed by sputter deposition. The bulk conductive film 204 has some Al crystals with surfaces along the (200) to help keep strain within the bulk conductive film 204 lower than if all of the bulk conductive film 204 was a monocrystalline Al film with its lower surface along the (111) crystal plane. Thus, the bulk conductive film 204 is polycrystalline with some Al crystals having surfaces along the (111) crystal plane and other Al crystals having surfaces along the (200) crystal plane.

The capping film 206 is optional and may be used as an anti-reflective film, a protective film, or the like. The capping film 206 can include one or more films that include one or more metals (e.g., Ti, Ta, W, TiW, Pt, Pd, Ni, or the like) or a metal nitride (TiN, TaN, WN, or the like). When the capping film 206 includes a metal or metal nitride either or both may react with the Al within the bulk conductive layer 204, and thus, the thickness of the bulk conductive film 204 may need to account for some of the Al within the bulk conductive film 204 that forms $Al_3Me$, $Me_2AlN$, MeN, or a combination thereof during a later anneal. The capping film 206 can be sputter deposited. When sputter depositing a metal nitride using a metal target, some of the ions (e.g., $Ar^+$) may cause some of the Me-N bonds to break allowing Me atoms to be deposited with the metal nitride film. Similarly, when reactive sputtering is used, some Me atoms may be deposited with the metal nitride film. Thus, the thickness of the bulk conductive film 204 may need to account for the intentional or inadvertent incorporation of Me atoms outside of a compound within the capping film 206.

The thicknesses of the films 202, 204, and 206 may depend at least partly on one another. Turning to the bulk conductive film 204, its thickness may depend on one or more considerations. A lower value for the thickness of the bulk conductive film 204 can depend on the thickness and compositions of the contacting film 202 and potentially on the thickness and composition of the capping film 206. More particularly, during a subsequent anneal, the metal atoms within the contacting film 202, the capping film 206, or both may react with the Al within the bulk conductive film 204 to form $Al_3Me$, $Me_2AlN$, MeN, or a combination thereof, wherein Me is the metal. Even if all of the metal atoms are reacted, the thickness of bulk conductive film 204 can have a thickness, such that some of the Al outside the metal compounds remains. This allows Al within the bulk conductive film 204 to make direct contact with the semiconductor layer 102 along the surface 104 during a subsequent anneal.

The relative content of Al and the metal within the contacting film 202 and the bulk conductive film can be used in determining thicknesses. The relative content of free Al, as expressed as an atomic %, can be given by the following equation:

$$Al_{rel}\% = Al_{free}/Al_{total} + Me_{total})*100\%,$$

where:

$Al_{rel}\%$ is the relative content of Al, $Al_{free}$ the number of Al atoms/unit area in the Al phase (not part of any compound with the metal Me like $Al_3Me$, $Me_2AlN$, MeN, or the like), $Al_{total}$ is the total number of Al atoms/unit area in films 202, 204, and 206, as free Al or in a compound with any other element, $Me_{total}$ is the total number of metal atoms/unit area in films 202, 204, and 206 present as free Me or in a compound with Al ($Al_3Me$, $Me_2AlN$, MeN, or the like), and The unit area is the same area (e.g., $mm^{-2}$, $cm^{-2}$, or the like) for $Al_{free}$, $Al_{total}$ and $Me_{total}$.

In an embodiment, $Al_{rel}\%$ is at least 35%, at least 40%, or at least 45% and in another embodiment $Al_{rel}\%$ is at most 100% (in an embodiment where no contacting and capping films 202 and 206 are used), at most 97%, or at most 95%. In a particular embodiment, the percentage of the $Al_{rel}\%$ along the surface 104 can be in a range from 80% to 95%. The significance of the values will become more significant later in this specification. $Al_{rel}\%$ can affect the thicknesses or one or both of the contacting film 202 and the bulk conductive film 204.

In an embodiment, the contacting film 202 has a thickness that is less than 10% of the thickness of the bulk conductive film 204, and in a particular embodiment, is less than 2% of the bulk conductive film 204. The thickness of the contacting film 202 may be in a range from 1 nm to 10 nm. In an embodiment, the thickness of the bulk conductive film 204 can be in a range from 50 nm to 900 nm, and in a particular embodiment, the thickness of the bulk conductive film 204 may be in a range from 100 nm to 500 nm.

The thickness of the capping film 206 may depend on the function that the capping film 206 is to provide. For example, when the capping film 206 is an anti-reflective film, the thickness may be a function of the wavelength of radiation used to pattern a subsequently-formed masking layer used to define conductive layer 200, or when the capping film 206 is a protective film, the thickness may be of a sufficient value to substantially prevent water vapor in air from reaching the bulk conductive film 204, or the like. In an embodiment, the capping film 206 can be in a range from 1 nm to 100 nm, and in a particular embodiment, the thickness of the capping film 206 may in a range from 5 nm to 30 nm. Depending on the composition of the capping film 206, the thickness of bulk conductive film 204 may or may not be significantly affected. As previously described, the thickness of the bulk conductive 204 is sufficient to ensure not all of the Al is reacted with one or more materials within the films 202 and 206.

Considerations for the thicknesses and possible ranges of thicknesses for the films 202, 204, and 206 are described above. The actual thicknesses used may depend on the application. Accordingly, the numerical values for the thicknesses of the films 202, 204, and 206 are illustrative and not limiting to the present invention. After reading this specification, skilled artisans will appreciate that thicknesses of the films 202, 204, and 206 can be thinner or thicker than the values previously described.

Figure 3:
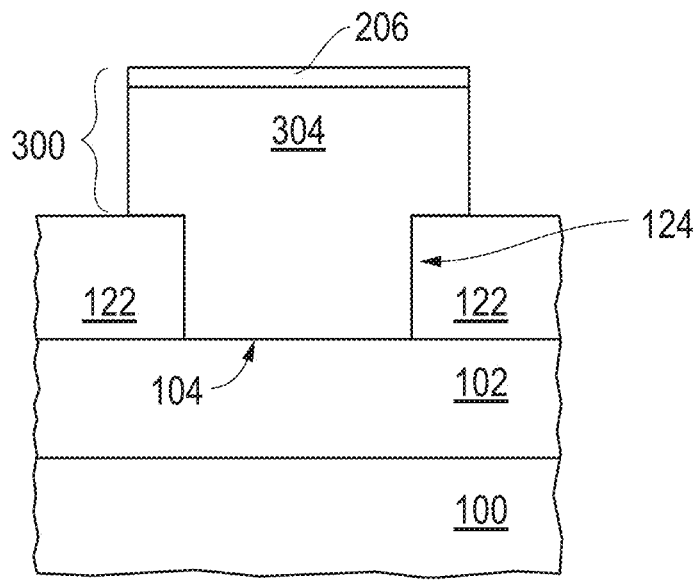
FIG. 3 includes an illustration of a cross-sectional view of the workpiece of FIG. 1 after forming a conductive layer in accordance with another embodiment.

In another embodiment, a different conductive layer can be used. FIG. 3 includes another embodiment that includes a conductive layer 300 that includes a bulk conductive film 304 and the capping layer 206. The bulk conductive layer 304 can include an alloy of Al and a metal, wherein on an atomic basis, the metal content is no more than 10 atomic % of the total atomic content of metals within the bulk conductive film 304. In another embodiment, the metal content is no more than 5 atomic % or 2 atomic %. In a further embodiment, the metal content is at least 0.01 atomic % of the Al content. The remainder of the bulk conductive film can be Al or nearly all Al (e.g., the remainder may be at least 98 atomic % Al). The bulk conductive film 304 can be formed by co-sputtering using separate Al-containing and metal-containing targets or by sputtering using a target including an alloy of Al and the metal element in their desired content levels as previously described. The Al-containing target or the alloy target can include one or more other elements, such as Cu, Si, W, or the like in amounts relative to Al as previously discussed.

The thickness of the bulk conductive film 304 can be in a range from 50 nm to 900 nm, and in a particular embodiment, the thickness of the bulk conductive film 304 may be in a range from 100 nm to 500 nm. Similar to the embodiment illustrated in FIG. 2, the capping film 206 in the conductive layer 300 is optional. The composition, thickness and other considerations previously described for the capping film 206 are applicable to the conductive layer 300.

Figure 4:
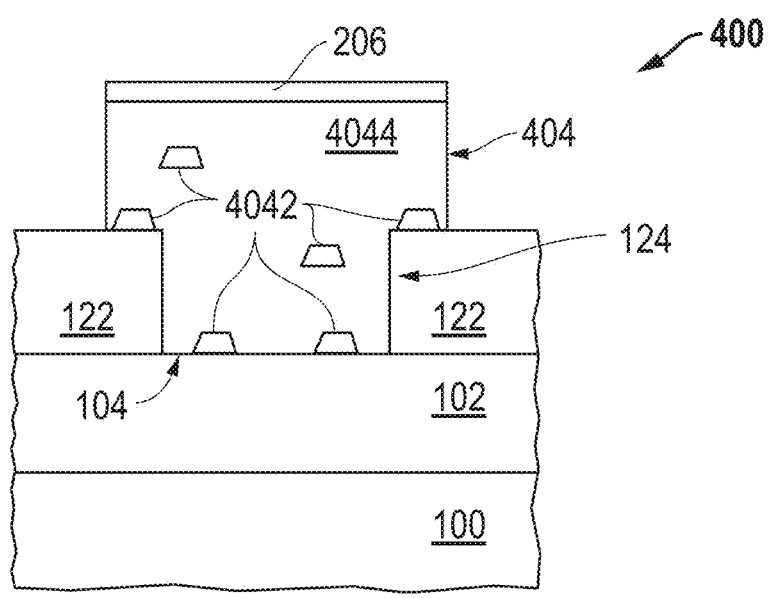
FIG. 4 includes an illustration of a cross-sectional view of the workpiece of FIG. 2 or 3 after patterning a patterned conductive layer to form a contact structure.

The conductive layer 200 or 300 can be patterned and subsequently annealed to form a contact structure 400, as illustrated in FIG. 4. The contact structure 400 that extends through the insulating layer 122 within the contact opening 124 and contacts the surface 104 of the semiconductor layer 102. In an embodiment, the removal can be performed using an etching technique or another conventional removal technique.

The workpiece including the contact structure 400 is annealed. The properties of the conductive layer can be affected by the temperature and time duration of the anneal. A relatively lower anneal temperature may be used with a relative longer time duration at such anneal temperature, and a relatively higher anneal temperature may be used with a relatively shorter time duration at such temperature.

Referring to FIGS. 2 and 3, part or all of the metal within the contacting film 202 or bulk conductive film 304 and, if applicable, within the capping film 206 can react with Al within bulk conductive film 204 or 304 to form $Al_3Me$, $Me_2AlN$, MeN, or a combination thereof, wherein Me is the metal. In the embodiment as illustrated in FIG. 4, the contact structure 400 includes an annealed conductive bulk film 404 that includes a solid Me—Al phase 4042 and a solid Al phase 4044. The Me—Al phase 4042 can include $Al_3Me$, $Me_2AlN$, MeN, or a combination thereof. In addition to Al, the Al phase 4044 may include Cu, Si, or another element that was present in the bulk conductive film 204 or 304 as deposited. The Al phase 4044 may include at least 90 atomic % or at least 95 atomic % Al.

The Me—Al phase 4042 can include discrete portions that are at least partly surrounded by the Al phase 4044. In the embodiment illustrated in FIG. 4, each of the phases 4042 and 4044 includes crystals that contact the semiconductor material, such as a III-N material, along the surface 104 of the semiconductor layer 102. In an embodiment, the surface 104 of the semiconductor layer 102 includes $Al_zGa_{(1-z)}N$, and the surface 104 is along the (0002) crystal plane, and the bulk conductive film 404 is polycrystalline and includes Al crystals having surfaces along the (111) crystal plane ("$Al_{111}$ crystals") that are in contact with the (0002) crystal plane of $Al_zGa_{(1-z)}N$. The lattice mismatch is approximately 9.6% for $Al_{0.25}Ga_{0.75}N$ and approximately 9.8% for GaN, and thus, in a finished device, the Al crystals has surfaces along (111) crystal plane that are aligned to the crystal lattice of the semiconductor layer 102. Such alignment can allow for a lower contact resistance.

In a finished device, the percentage of the surface 104 in contact with the Al phase 4044 can be varied. As described herein, generally, a higher percentage of the Al phase 4044 in contact along the surface 104 of the semiconductor layer 102 provides a lower and more consistent (lower standard deviation) contact resistance. Along the surface 104, the Al phase 4044 occupies at least 1%, at least 5%, or at least 10% of the surface 104, and in another embodiment, the Al phase 4044 occupies at most 100% (no Me—Al phase along the surface 104), at most 95%, or at most 90% of the surface 104. In a particular embodiment, the Al phase 4044 occupies an area of the surface 104 that is in a range from 50% to 95%.

Below, some anneal temperatures and time durations at the anneal temperatures are provided for guidance and not to limit the actual anneal temperature and time duration used. In an embodiment, the anneal temperature can be at least 500° C., at least 525° C., or at least 550° C., and in another embodiment, the anneal temperature can be at most 950° C., at most 925° C., or at most 900° C. In a particular embodiment, the anneal temperature is in a range from 550° C. to 800° C. In an embodiment, the time duration at the anneal temperature can be at least 30 s, at least 45 s, or at least 60 s, and in another embodiment, the time duration is at most 300 s, at most 270 s, or at most 240 s. In a particular embodiment, the time duration is in a range from 60 s to 180 s. The anneal temperature and time duration may be outside the values described above. After reading this specification, skilled artisans will be able to determine an anneal temperature and time duration to meet the needs or desires for a particular application.

In another embodiment, the patterning and annealing operations may be reversed. In particular, the conductive layer 200 or 300 may be annealed before such conductive layer is patterned to form the contact structure 400 in FIG. 4. In a further embodiment (not illustrated), the capping film 206 can be formed later in the process sequence. After forming the conductive bulk film 204 or 304, the previously described anneal can be performed before forming the capping film 206. After the anneal is performed, the capping film 206 can be formed, and the resulting conductive layer can be patterned to form a conductive structure.

Figure 5:
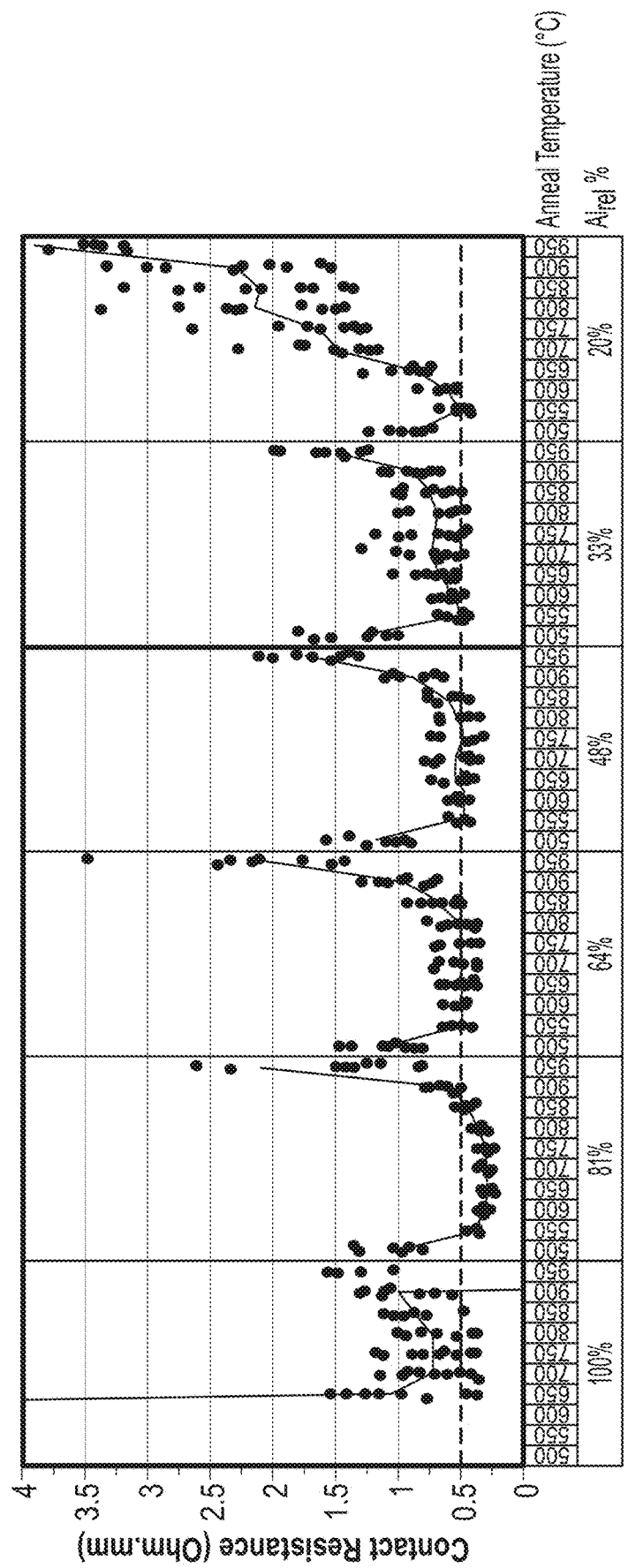
FIG. 5 includes plots of contact resistance for different relative Al contents within a bulk conductive film.

FIGS. 5 to 9 includes plots of contact resistance for different $A_{rel}$% values, annealing temperatures, contact opening size, and time durations for the anneal. The contact structures are based on the conductive layer 200 as illustrated in FIG. 2 that forms the contact structure 400 as illustrated in FIG. 4. FIG. 5 includes plots of contact resistance at temperatures in a range from 500° C. to 950° C. for different $Al_{rel}$% values. The contacts have areal dimensions of 100 microns×100 microns, and the anneal times are 90 s. When the percentage of $Al_{rel}$% is 20%, the average contact resistance is over 0.5 ohm*mm for all anneal temperatures, and the standard deviation of the contact resistance is relatively high at 500° C. and temperatures of at least 650° C. When $Al_{rel}$% is at 33%, the average contact resistance at each anneal temperature listed in FIG. 5 is over 0.5 ohm*mm, and the standard deviation is relatively high as compared to the higher $Al_{rel}$% values; however, it is significantly better than the $Al_{rel}$% at 20%. For $Al_{rel}$% at 48%, 64%, and 81%, the average contact resistances and standard deviations are even lower for many of the annealing temperatures. However, the average contact resistance and standard deviation may increase when $Al_{rel}$% is 100% (no contacting film 202 or both the contacting and capping films 202 and 206). As seen in FIG. 5, at 100%, the average contact resistance is greater than 0.5 ohm*mm and the standard deviation is relatively high for all anneal temperatures, as compared to examples with $Al_{rel}$% at 48% to 81%.

Figure 6:
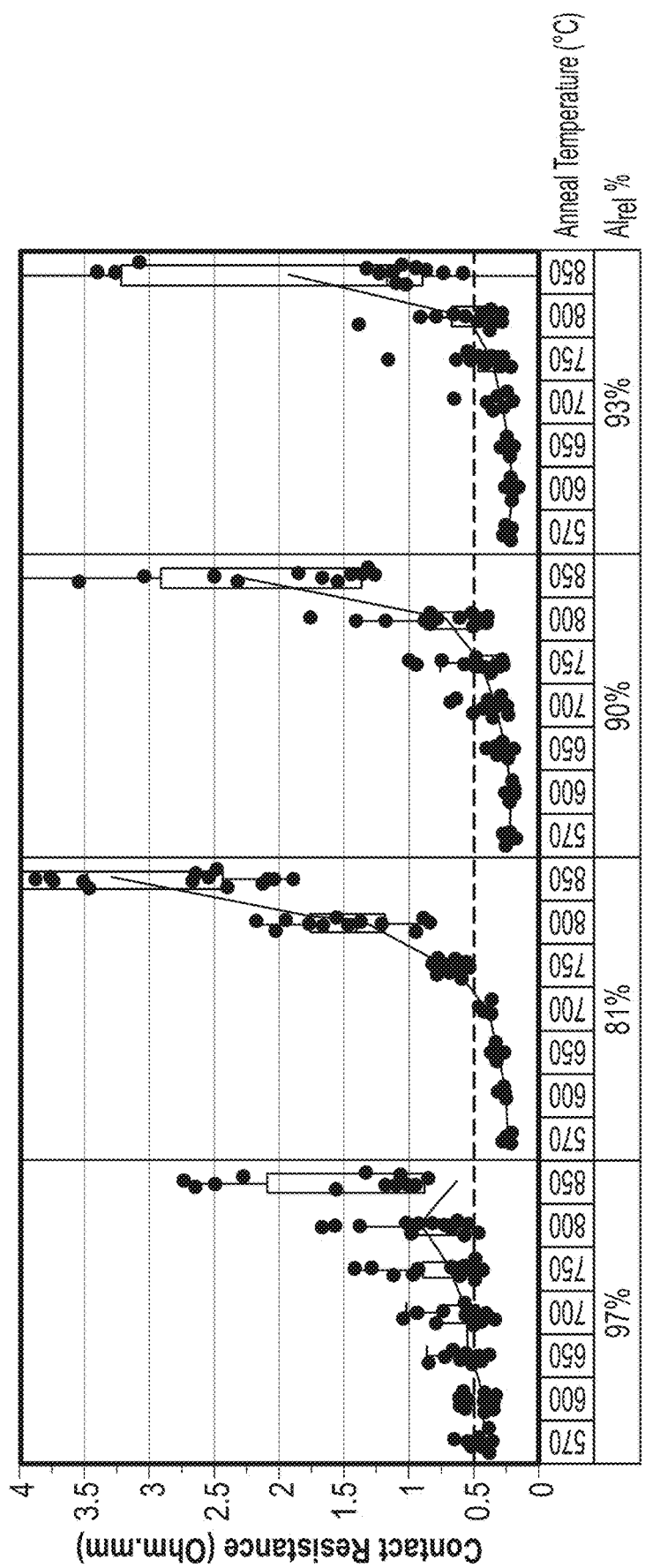
FIG. 6 includes plots of contact resistance for contacts having a particular contact size at different annealing temperatures.
Figure 7:
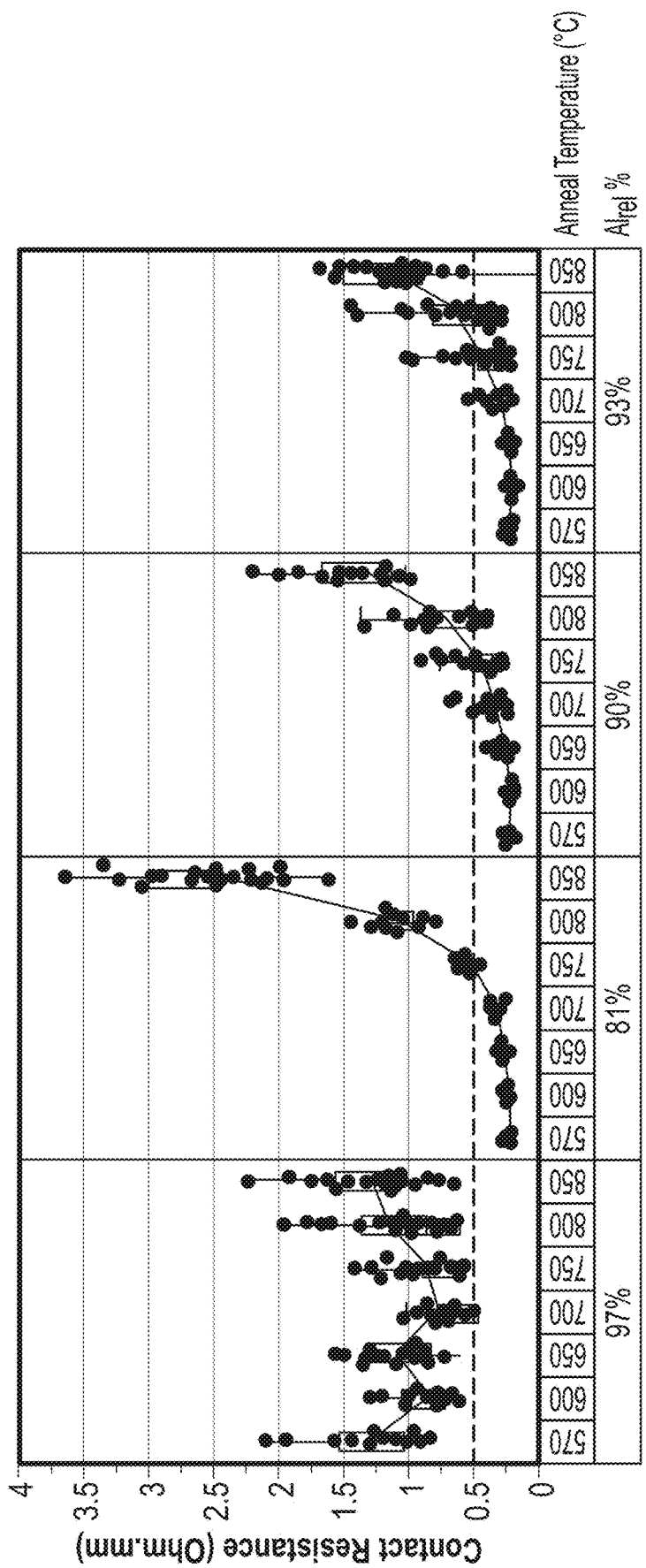
FIG. 7 includes plots of contact resistance for contacts having another particular contact size at different annealing temperatures.

FIGS. 6 and 7 are similar except smaller contact areas are used, and $Al_{rel}$% is in a range of 81% to 97%. The anneal temperatures are in a range of 570° C. to 850° C., and the time duration for each anneal is 90 s. The contact area in FIG. 6 is 2 microns×100 microns, and the contact area in FIG. 7 is 6 microns×100 microns. When comparing the different $Al_{rel}$% values, for the different anneal temperatures, $Al_{rel}$% of 97% has average contact resistances and standard deviations that are between the average contact resistances and standard deviations for $Al_{rel}$% of 100% and $Al_{rel}$% of 93%. Average contact resistances and standard deviations for $Al_{rel}$% of 81%, 90%, and 93% are similar to each other at lower anneal temperatures, and at higher anneal temperatures $Al_{rel}$% of 93% is slightly better (lower average contact resistance and standard deviation) than $Al_{rel}$% of 90%, which is slightly better than $Al_{rel}$% of 81%.

Figure 8:
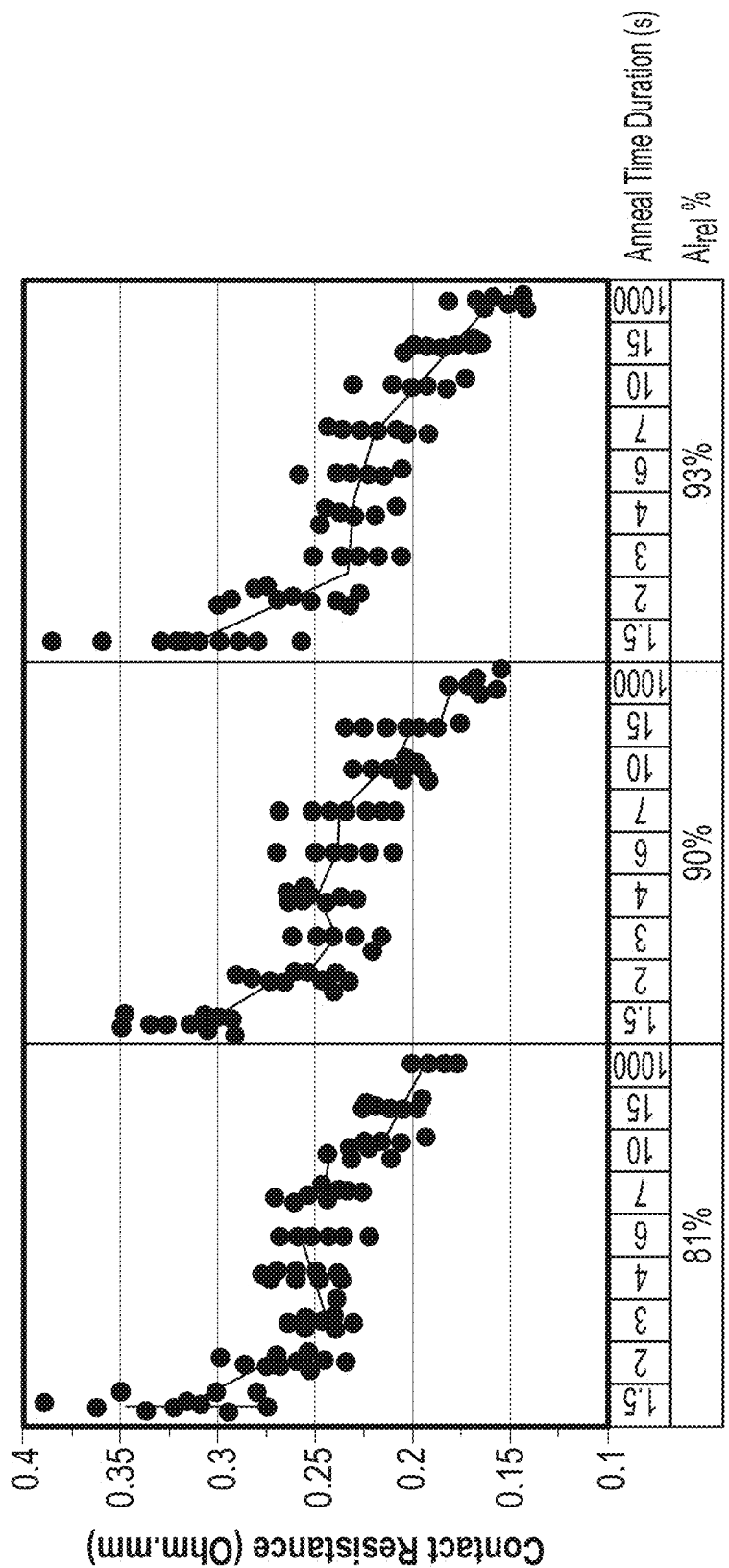
FIG. 8 includes plots of contact resistance for different contact sizes for particular relative Al contents within a bulk conductive film.

FIG. 8 includes plots that illustrate the effect of contact area on the contact resistances for $Al_{rel}$% of 81%, 90%, and 93%. The anneal temperature is 570° C., and the time duration is 90 s. The contact area ranges from 1.5 microns×100 microns to 100 microns×100 microns. For each for $Al_{rel}$%, average contact resistance and standard deviation decreases with increasing contact area. Overall, for a particular contact area, the average contact resistance and standard deviation is better as for $Al_{rel}$% increases from 81% to 93%

Figure 9:
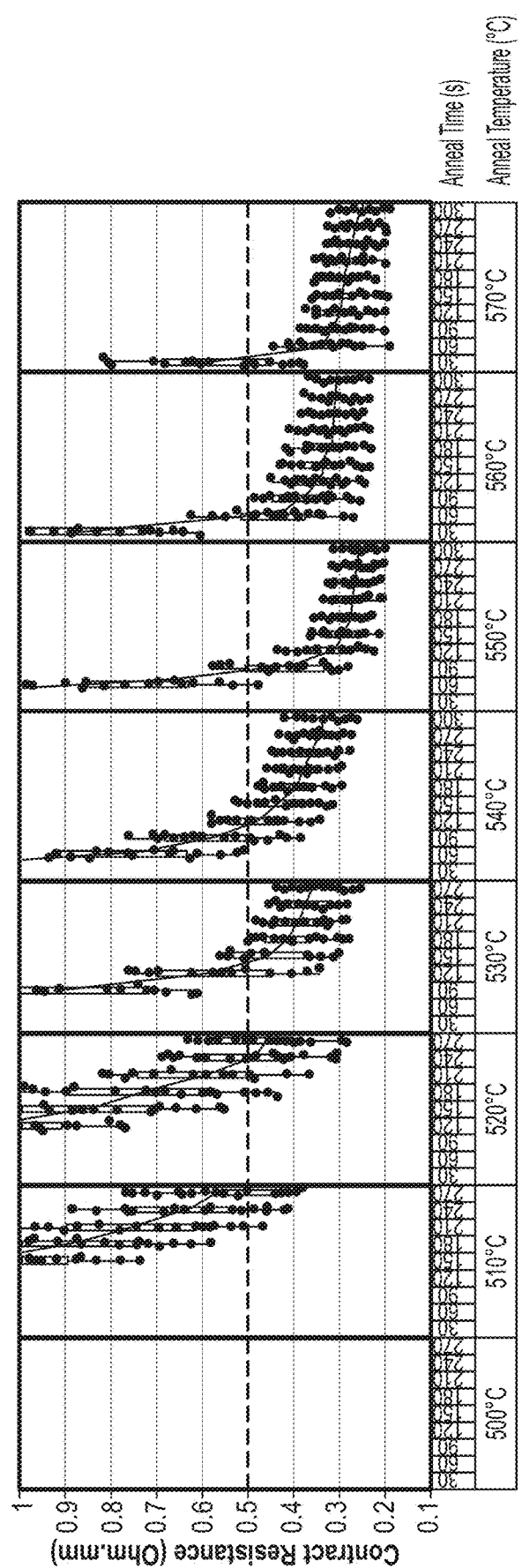
FIG. 9 includes plots of contact resistance for anneal time durations for particular samples and anneal temperatures.

FIG. 9 includes plots that illustrate the effect of anneal temperature for different time durations on the contact resistances for different bulk conductive film 204 compositions and sputtering conditions. AlCu refers to a bulk conductive film with approximately 99.5 atomic % Al and approximately 0.5 atomic % Cu, and AlCuW refers to a bulk conductive film with approximately 98.5 atomic % Al, approximately 1 atomic % Cu, and approximately 0.5 atomic % W. The contact area is 6 microns×100 microns, and $Al_{rel}$% is 80%. $Al_{rel}$% for this example is 81%. As seen with AlCu sputtered at 350° C. ("AlCu @ 350° C."), contact resistance improves with longer anneal time for temperatures between 500° C. to 570° C. Although the contact resistances at lower temperatures and relatively shorter time durations do not appear in the plots, substantially longer anneal times, such as 10 minutes or longer, may be able to provide acceptable contact resistances, even at a temperature as low as 500° C. At temperatures in a range of 550° C. to 570° C., an anneal time of 60 s is sufficient for the average contact resistance to be less than 0.5 ohm*mm. An average contact resistance of at most 0.5 ohm*mm can be achieved when the anneal temperature is 520° C. and the time duration is 240 s, the anneal temperature is 530° C. and the time duration is 150 s, and the anneal temperature is 540° C. and the time duration is 120 s.

One example has a bulk conductive film 204 that includes AlCu and is sputtered without any external heat applied to the substrate chuck (AlCu@50° C.) and the anneal temperature is 570° C. For the same time durations for the anneal, the AlCu@350° C. sample performed better than the AlCu@50° C. sample. Overall, sputtering conditions, such as substrate temperature, pressure, and power, do not have a significant impact on the contact resistance.

The improvement to (lowering of) the contact resistance can help to reduce on-state resistance (Rdson). The reduction in Rdson can be particularly significant in power transistors, as a lower Rdson results in less energy loss as current passes through the power transistor when the transistor is in the on-state. The description below addresses a high electron mobility transistor (HEMT) to provide a particular embodiment in which the contact structure provides lower contact resistance, and hence, lower Rdson and higher on-state Ids.

As previously described, either or both of the contacting film and bulk conductive layer, as deposited, can be aligned to an underlying film or layer. FIGS. 10 to 17 include pictures of X-Ray Diffraction (XRD) data for different compositions of the conductive layer. The data in FIGS. 10 to 17 are based in-situ XRD measurements, where each sample is ramped at 1° C. per second, and XRD was continuously monitored. Thus, the conductive layer as deposited can always be read at the left-hand side of each plot. In the examples below, the semiconductor layer is a monocrystalline layer of $Al_{0.25}Ga_{0.75}N$. The examples are intended to illustrate and not limit the scope of the present invention as defined in the appended claims. After reading this specification, skilled artisans will be able to use other compositions of the semiconductor layer without departing from the concepts as described herein. The diffraction peaks coming from the substrate and the GaN/AlGaN layers can be suppressed by adding a little inclination to the sample of few degrees, typically 6°.

Figure 10:
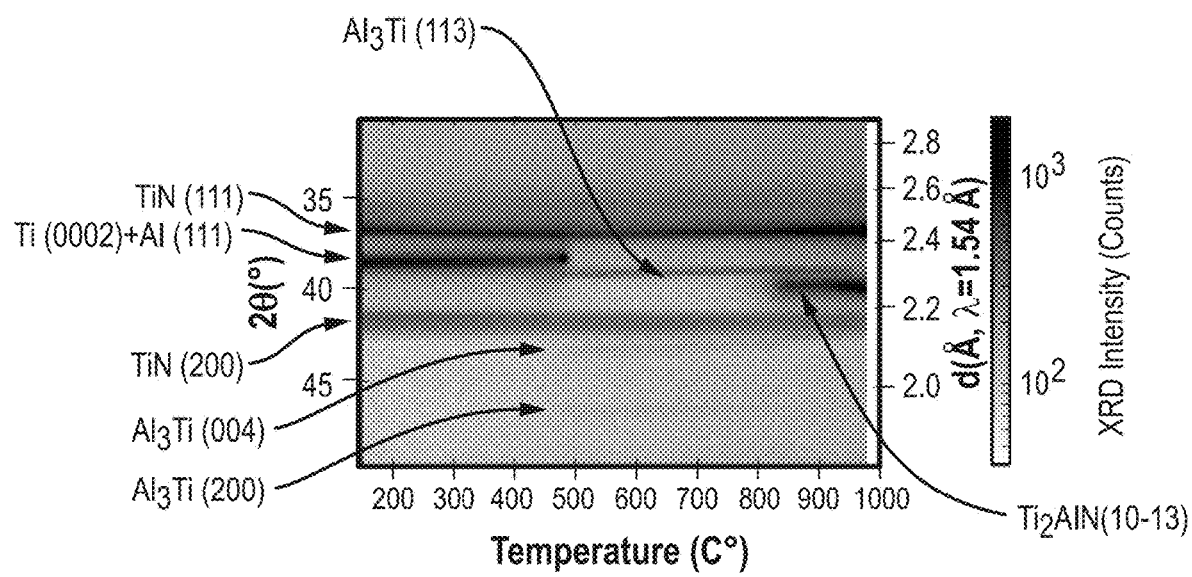
FIG. 10 includes pictures of XRD data that suggest the presence and absence of materials within a conductive layer over a range of temperatures.

FIG. 10 includes XRD data for a conductive layer that includes Ti for the contacting layer 202, Al for the conductive bulk film 204, and TiN as the capping film 206. In this particular example, $Al_{rel}\%$ is 74%. Along the left-hand side, data for Ti (0002), Al (111), TiN (111), and TiN (200) can be seen. Ti (0002) and Al (111) signals are coinciding. The presence of Ti (0002) corresponds to the presence of the hexagonal α-Ti phase of the contacting film 202 being aligned to $Al_{0.25}Ga_{0.75}N$ (0002) along the surface 104 of the semiconductor layer 102, and Al (111) of the conductive bulk film 204 being aligned to Ti (0002) of the contacting film 202.

At approximately 400° C., data corresponding to $Al_3Ti$ (113) becomes apparent, at approximately 450° C., $Al_3Ti$ (004) becomes apparent, and at approximately 480° C., $Al_3Ti$ (113) and minor signals of $Al_3Ti$ (004) and $Al_3Ti$ (200) becomes apparent and Ti (0002)+Al (111) ends. Thus, all of the Ti and the Al within the contacting and bulk conductive films are consumed, and thus, substantially all of an annealed bulk conductive film is $Al_3Ti$. TiN (111) and TiN (200) are still present, so the conductive layer includes an annealed bulk conductive film of $Al_3Ti$ and a capping layer of TiN. When further heated at a temperature of approximately 800° C. and higher, $Ti_2AlN$ (10-13) become apparent. Thus, some of the $Al_3Ti$ reacts with the Ti in excess compared to Al, and with the $Al_{0.25}Ga_{0.75}N$ or the TiN to form $Ti_2AlN$. Thus, the conductive layer includes $Ti_2AlN$ as the annealed contacting film, a lower amount of $Al_3Ti$ within the anneal bulk conductive film, and a remaining portion of TiN as the annealed capping film.

The data in FIG. 10 suggest that an insufficient amount of Al may be present in the bulk conductive film 202 as deposited, as substantially all of the Al is consumed to form $Al_3Ti$, which has a higher resistivity compared to Al within the bulk conductive film 202. $Al_3Ti$ has a tetragonal lattice structure and will not align to the $Al_{0.25}Ga_{0.75}N$.

Figure 11:
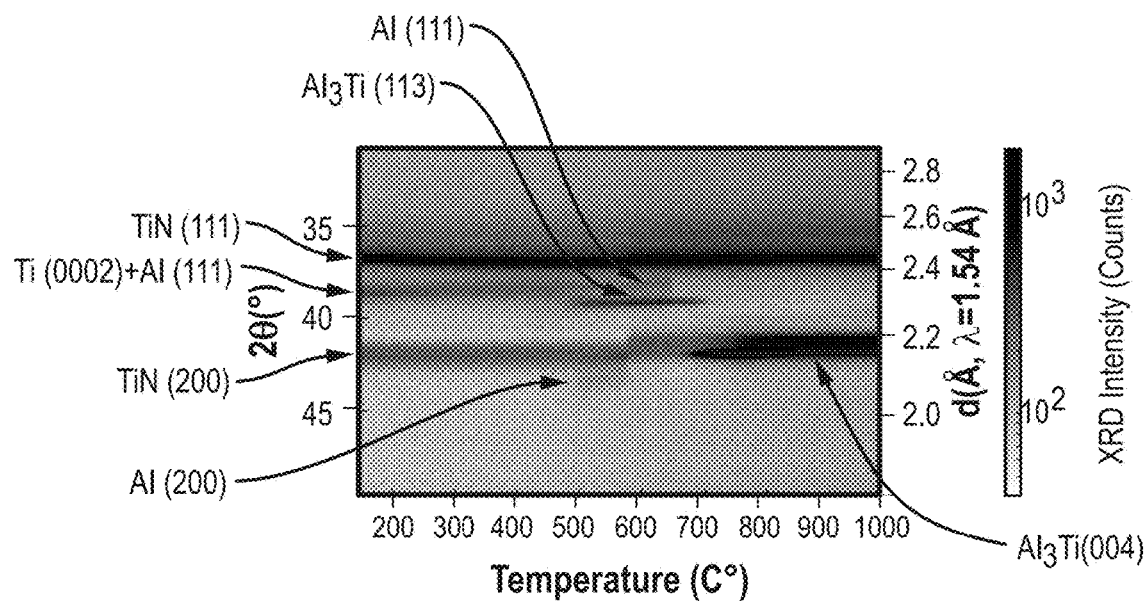
FIG. 11 includes pictures of XRD data that suggest the presence and absence of materials within another conductive layer over a range of temperatures.

Referring to FIG. 11, the conductive layer as deposited is similar to FIG. 10 except that $Al_{rel}\%$ is 92%. Ti (0002) within the contacting film 202 is present and aligned to $Al_{0.25}Ga_{0.75}N$ (0002) along the surface 104 of the semiconductor layer 102, and Al (111) of the conductive bulk film 204 is aligned to Ti (0002) of the contacting film 202.

Figure 13:
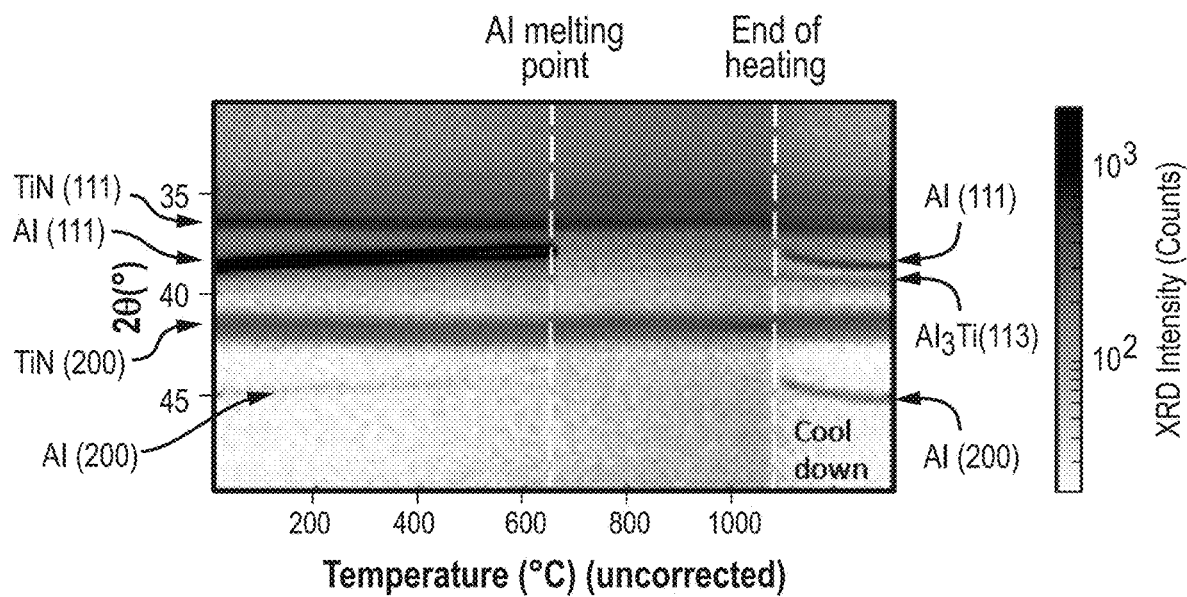
FIG. 13 includes pictures of XRD data that suggest the presence and absence of materials within a further conductive layer over a range of temperatures.

Unlike FIG. 10, in FIG. 11 the coinciding signals of Ti (0002) and Al (111) remain apparent up to about 650° C. In fact, the Ti (0002), corresponding again to the hexagonal α-Ti phase, still disappears at about 480° C. and gets fully consumed to form $Al_3Ti$ (113). The excess of Al (111) and a minor peak of Al (200) remains until the Al melts at about 660° C. In FIG. 13, it will be demonstrated the Al (111) and Al (200) signals reappear when the sample cools down and the Al recrystallizes. Thus, Al is present at all temperatures because Al (111) is deposited in an amount such that Al (111) is present even when all Ti (0002) is consumed in a reaction with Al (111). $Al_3Ti$ (113) is no longer apparent at approximately 700° C. and reorients into $Al_3Ti$ (004). TiN (111) and TiN (200) in the capping film 206 are seen at all temperatures. Thus, at anneal temperatures of approximately 480° C. and higher, the annealed conductive bulk film includes Al and $Al_3Ti$, and the annealed capping film includes TiN. The Al (111) orientation and a minimal lattice mismatch with $Al_{0.25}Ga_{0.75}N$ of about 9.5% suggests epitaxial or fiber structure alignment of the Al with the $Al_{0.25}Ga_{0.75}N$.

Figure 12:
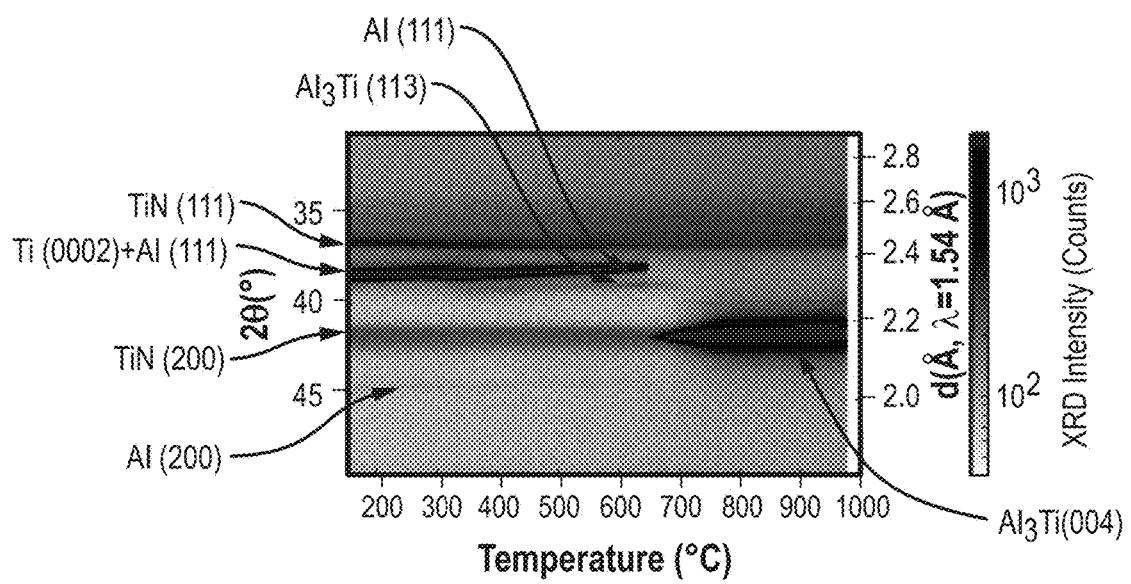
FIG. 12 includes pictures of XRD data that suggest the presence and absence of materials within still another conductive layer over a range of temperatures.

Referring to FIG. 12, the conductive layer as deposited is similar to FIG. 11 except that the contacting film 202 and bulk conductive film 204 are reversed. Al (111) of the conductive bulk film is aligned to $Al_{0.25}Ga_{0.75}N$ (0002) along the surface 104 of the semiconductor layer 102. Al (200) of the bulk conductive film 204 can also be seen.

FIG. 12 includes Ti (0002) (referring to α-Ti), Al (111) and Al (200) up to about 660° C. Thus, Al (111) is present until the remaining Al melts because Al (111) is deposited in an amount such that Al (111) is present even when all Ti (0002) is consumed in a reaction with Al (111). $Al_3Ti$ (113) becomes apparent at approximately 320° C., $Al_3Ti$ (113) is no longer apparent at approximately 700° C. $Al_3Ti$ (004) becomes apparent at temperatures of approximately 650° C. TiN (111) and TiN (200) in the capping film 206 are seen at all temperatures. Thus, at anneal temperatures of approximately 480° C. and higher, the annealed conductive bulk film includes Al and $Al_3Ti$, and the annealed capping film includes TiN. The Al (111) orientation and a minimal lattice mismatch with $Al_{0.25}Ga_{0.75}N$ of about 9.5% suggests epitaxial or fiber structure alignment of the Al with the $Al_{0.25}Ga_{0.75}N$.

Referring to FIG. 13, the conductive layer as deposited is similar to FIG. 11 except that the contacting film 202 is not present. Al (111) of the conductive bulk film is aligned to $Al_{0.25}Ga_{0.75}N$ (0002) along the surface 104 of the semiconductor layer 102. Al (200) of the bulk conductive film 204 can also be seen.

FIG. 13 includes TiN (111) and TiN (200) at all temperatures. The signal for Al (111) and Al (200) is no longer seen at about 660° C., as the Al melts. Upon cooling, the Al solidifies, and Al (111) and Al (200) become present. $Al_3Ti$ (113) is relatively faint at relative high temperatures. Thus, a relatively small amount of Ti from the capping film reacts with the Al. The Al (111) orientation and a minimal lattice mismatch with $Al_{0.25}Ga_{0.75}N$ of about 9.5% suggests epitaxial or fiber structure alignment of the Al with the $Al_{0.25}Ga_{0.75}N$.

Figure 14:
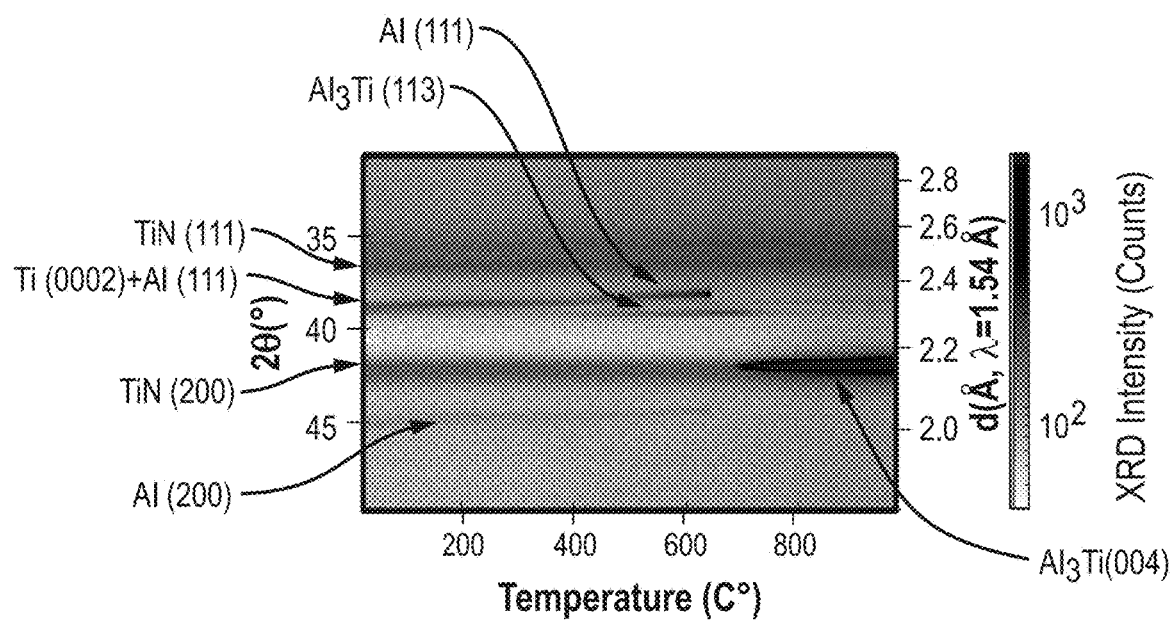
FIG. 14 includes pictures of XRD data that suggest the presence and absence of materials within a conductive layer over a range of temperatures.

Referring to FIG. 14, the bulk conductive film 304 is deposited as a mixture of Al and Ti with a $Al_{rel}$ is 92%, instead of separate contacting and bulk conductive films. Ti (0002) and Al (111) within the contacting film 202 is aligned to $Al_{0.25}Ga_{0.75}N$ (0002) along the surface 104 of the semiconductor layer 102. The materials and phases as seen in FIG. 14 are similar to FIG. 12.

FIG. 14 includes Ti (0002) (referring to α-Ti), Al (111) and Al (200) up to about 660° C. The signal for Ti (0002) disappears at about 480° C. when all Ti gets consumed to form $Al_3Ti$ (113) in reaction with Al (111) and Al (200) and the signals for the excess of Al (111) and Al (200) disappear at approximately 660° C., as the Al melts. Signals for $Al_3Ti$ (113), and $Al_3Ti$ (004) become apparent at approximately 350° C., and 660° C. Thus, all Ti (0002) is consumed in a reaction with Al. Upon cooling, signals (not illustrated in FIG. 14) reappear as the Al cools below its melting point. Al (111) is present along the surface of $Al_{0.25}Ga_{0.75}N$. The Al (111) orientation and a minimal lattice mismatch with $Al_{0.25}Ga_{0.75}N$ of about 9.5% suggests epitaxial or fiber structure alignment of the Al with the $Al_{0.25}Ga_{0.75}N$.

Figure 15:
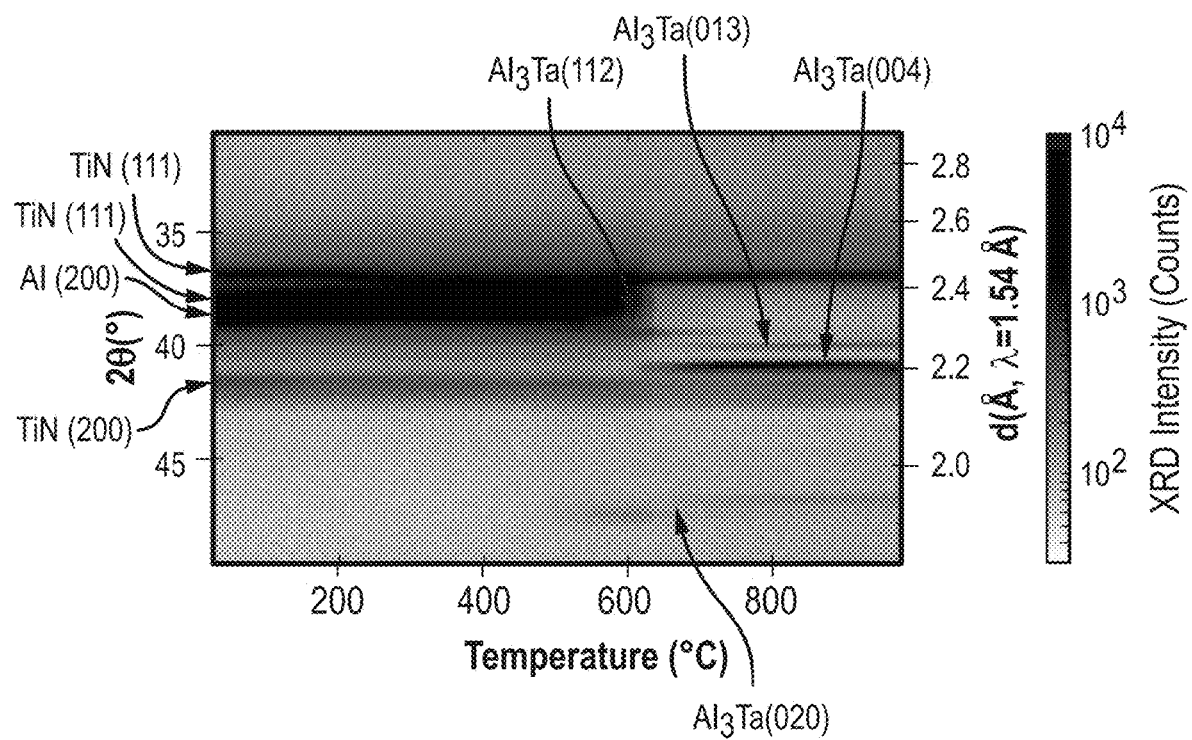
FIG. 15 includes pictures of XRD data that suggest the presence and absence of materials within another conductive layer over a range of temperatures.

Referring to FIG. 15, the conductive layer as deposited is similar to FIG. 11 except Ta replaces Ti in the contacting film 202, and $Al_{rel}\%$ is 91%. As deposited, signals of Ta (111), Al (111), TiN (111) and TiN (200) are apparent, Ta (111) corresponds to the fcc-Ta phase. At a temperature of about 500° C., the signals Ta (111) and Al (111) become faint, and $Al_3Ta$ (112) and $Al_3Ta$ (020) appear. The Ta (111) gets completely consumed at about 630° C. to form $Al_3Ta$ in reaction with Al (111). The remaining Al (111) disappears, when the Al melts. Other $Al_3Ta$ signals appear at higher temperatures: $Al_3Ta$ (004) at about 630° C. and $Al_3Ta$ (013) at about 680° C. TiN (111) remains apparent over the full temperature range. Thus, at anneal temperatures of approximately 500° C. and higher, the annealed conductive bulk film includes Al and Al₃Ta, and the annealed capping film includes TiN. The Al (111) orientation and a minimal lattice mismatch with $Al_{0.25}Ga_{0.75}N$ of about 9.5% suggests epitaxial or fiber structure alignment of the Al with the $Al_{0.25}Ga_{0.75}N$.

Figure 16:
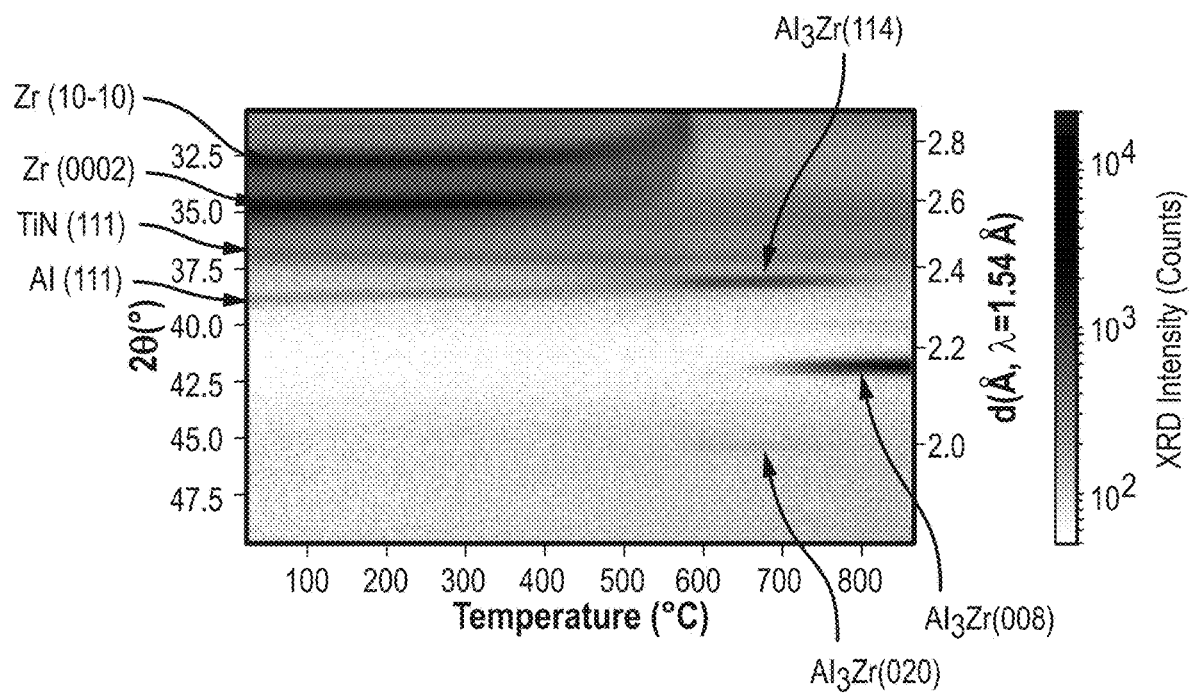
FIG. 16 includes pictures of XRD data that suggest the presence and absence of materials within still another conductive layer over a range of temperatures.

Referring to FIG. 16, the conductive layer as deposited is similar to FIG. 11 except Zr replaces Ti in the contacting film 202, and $Al_{rel}$ % is 85%. As deposited, signals of Al (111), TiN (111), Zr (0002) and Zr (10-10) are apparent. From a temperature of about 450° C. on, the signals of Al (111), Zr (0002) and Zr (10-10) become faint and faint signals of Al₃Zr (114) and Al₃Zr (020) appear. At about 580° C. all Zr (0002) and Zr (10-10) are consumed to form Al₃Zr in reaction with Al (111). The remaining Al (111) signal gets covered by the Al₃Zr (114) signal, until the Al melts at about 650° C. From about 700° C. and higher, the Al₃Zr (114) and Al₃Zr (020) reorient into Al₃Zr (008). Thus, at anneal temperatures of approximately 580° C. and higher, the annealed conductive bulk film includes Al and Al₃Zr, and the annealed capping film includes TiN. The Al (111) orientation and a minimal lattice mismatch with $Al_{0.25}Ga_{0.75}N$ of about 9.5% suggests epitaxial or fiber structure alignment of the Al with the $Al_{0.25}Ga_{0.75}N$.

Figure 17:
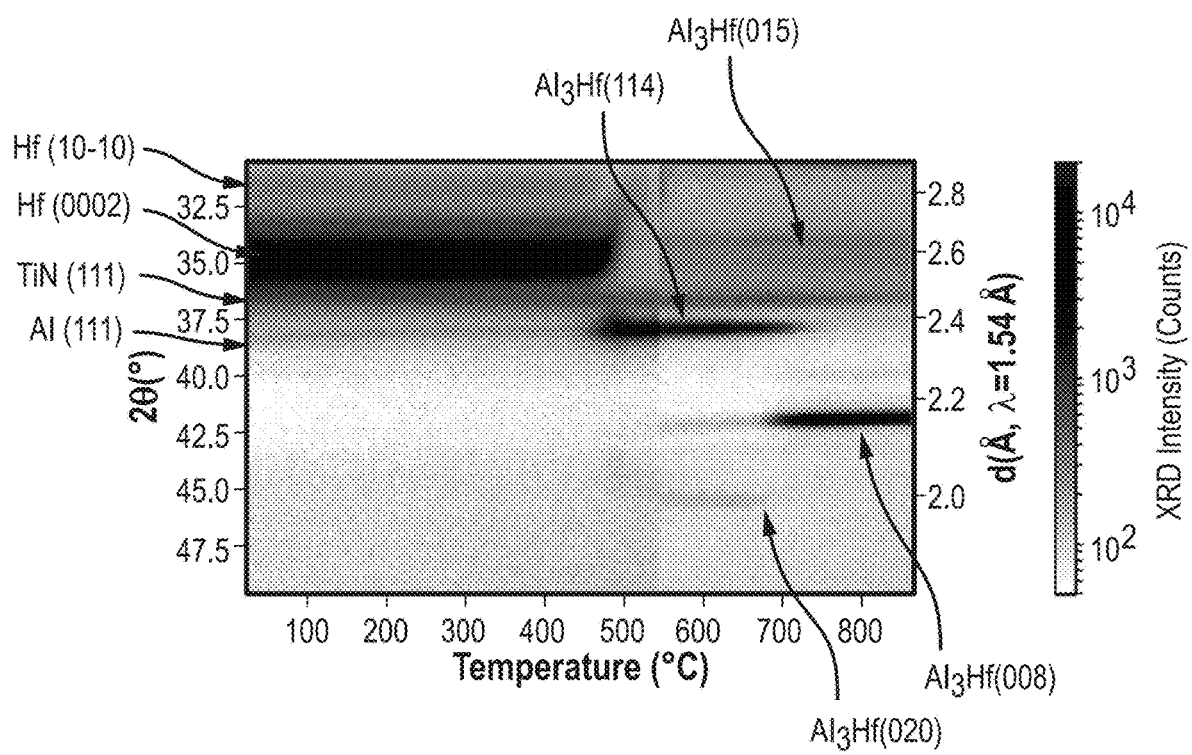
FIG. 17 includes pictures of XRD data that suggest the presence and absence of materials within a further conductive layer over a range of temperatures.

Referring to FIG. 17, the conductive layer as deposited is similar to FIG. 11 except Hf replaces Ti in the contacting film 202, and $Al_{rel}$ % is 85%. As deposited, signals of Al (111), TiN (111), Hf (0002) and Hf (10-10) are apparent. At a temperature of about 460° C., Hf (0002) and Hf (10-10) disappear, and Al₃Hf (114) becomes apparent, coinciding with Al (111) signal. The remaining Al (111) disappears when the Al melts at about 650° C. Minor signals of Al₃Hf (015) and Al₃Hf (020) are also apparent. From about 700° C. and higher, the Al₃Hf (114) and Al₃Hf (020) reorient into Al₃Hf (008). Thus, at anneal temperatures of approximately 460° C. and higher, the annealed conductive bulk film includes Al and Al₃Hf, and the annealed capping film includes TiN. The Al (111) orientation and a minimal lattice mismatch with $Al_{0.25}Ga_{0.75}N$ of about 9.5% suggests epitaxial or fiber structure alignment of the Al with the $Al_{0.25}Ga_{0.75}N$.

In summary, XRD data and the small mismatch of lattice constants suggest that, as deposited, the contacting film 202, the bulk conductive film 204, and the bulk conductive film 304 are aligned to the underlying layer or film. Further, different metals can be used to achieve and still achieve alignment. After annealing, the Al phase 4044 has a (111) orientation which together with its minimal lattice mismatch with $Al_{0.25}Ga_{0.75}N$ of about 9.5% suggests epitaxial or fiber structure alignment of the Al with the $Al_{0.25}Ga_{0.75}N$.

An exemplary electronic device that can leverage the concepts described herein can include a transistor, resistor, capacitor, or another electronic component where low-resistance ohmic contacts are desired. The description of a HEMT structure below is intended to illustrate and not limit the scope of the present invention as defined in the appended claims.

Figure 18:
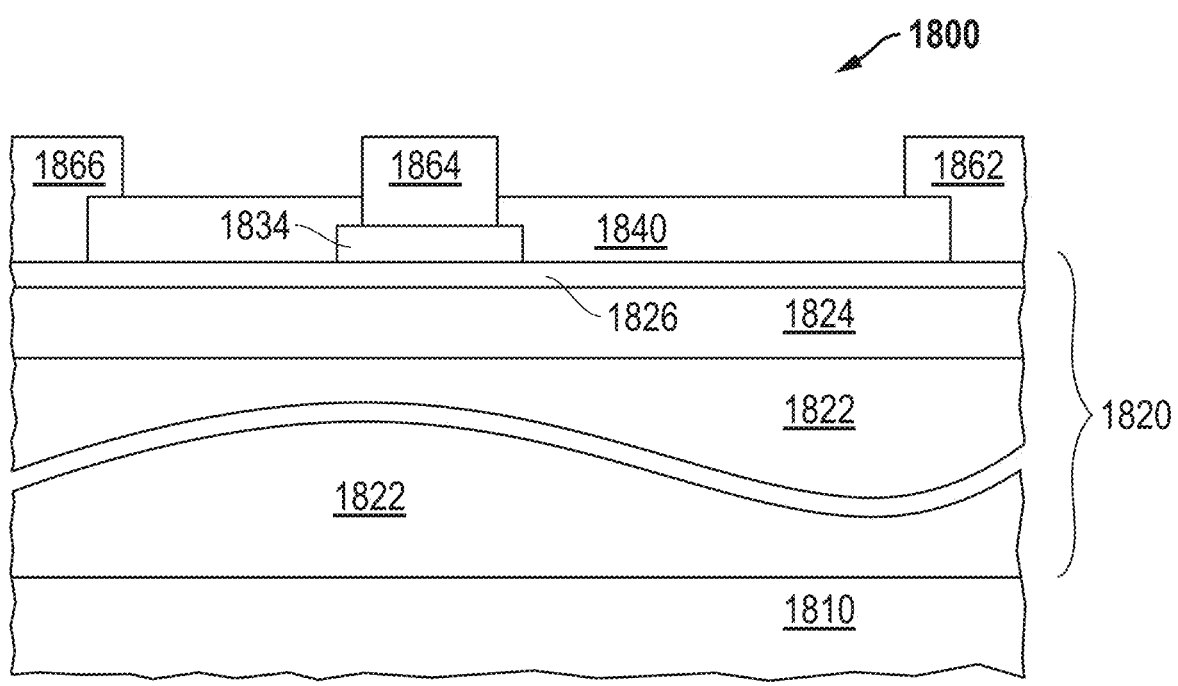
FIG. 18 includes an illustration of a cross-sectional view of a portion of a workpiece including a high electron mobility transistor structure including contact structures.

FIG. 18 includes a cross-sectional view of a portion of a workpiece 1800 that includes a HEMT structure. Below is a description of the physical structure. Details regarding an exemplary formation process, other than the formation of the source, gate, and drain electrodes are described in U.S. patent application Ser. No. 15/893,328 filed Feb. 9, 2018 and is incorporated herein by reference.

The workpiece 1800 includes a substrate 1810, a semiconductor stack 1820, a gate electrode 1834, an insulating layer 1840, and electrodes 1862, 1864, and 1866. The substrate 1810 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the semiconductor stack 1820 that will be subsequently formed over the substrate 1810.

The semiconductor stack 1820 can include a buffer layer 1822, a channel layer 1824, and a barrier layer 1826. Each of the layers within the semiconductor stack 1820 can include a III-N material, and in a particular embodiment include $Al_xGa_{(1-x)}N$, where 0≤x≤1. The composition of the buffer layer 1822 may depend on the composition of the channel layer 1824. The composition of the buffer layer 1822 can be changed as a function of thickness, such that the buffer layer 1822 has a relatively greater aluminum content closer to the substrate 1810 and relatively greater gallium content closer to the channel layer 1824. In a particular embodiment, the cation (metal atoms) content in the buffer layer 1822 near the substrate 1810 can be 10 atomic % to 100 atomic % Al with the remainder Ga, and the cation content in the buffer layer 1822 near the channel layer 1824 can be 0 atomic % to 50 atomic % Al with the remainder Ga. The buffer layer 1822 can have a thickness in a range from approximately 1 micron to 5 microns.

The channel layer 1824 can include $Al_yGa_{(1-y)}N$, where 0≤y≤0.1 and have a thickness in a range from approximately 10 nm to 4000 nm, and in a particular embodiment is in a range from 100 nm to 1200 nm. In another particular embodiment, the thickness can be in a range from 20 nm to 90 nm. In a particular embodiment, the channel layer 1824 is a GaN layer that may be doped with an electron donor (n-type) dopant or an electron acceptor (p-type) dopant.

The barrier layer 1826 can include a III-V material. In a particular embodiment, the barrier layer 1826 can include $Al_zGa_{(1-z)}N$, wherein 0.02≤z≤0.5, and in a particular embodiment 0.11≤z≤0.3. The barrier layer 1826 can have a thickness in a range from approximately 2 to 30 nm. The barrier layer 1826 has a hexagonal lattice structure and a surface 1828 along the (0002) crystal plane.

In an embodiment, the HEMT can be an enhancement-mode transistor, and the gate electrode 1834 can include p-type GaN having a dopant concentration in a range from $1×10^{18}$ atoms/cm³ to $1×10^{21}$ atoms/cm³. The gate electrode 1834 can have a thickness in a range from 20 nm to 300 nm. In another embodiment, p-type GaN can be replaced by a gate dielectric layer and a metal gate electrode. In a further embodiment, the HEMT can be a depletion-mode transistor. In such a transistor, a relatively thin dielectric layer that still allows a two dimensional electron gas to be under the gate structure (e.g., approximately 1 nm to 50 nm thick) and metal gate electrode can be used. The remaining description is based on the gate electrode 1834 including a p-type GaN material.

The insulating layer 1840 can include one or more insulating films that can include a nitride, an oxide, or an oxynitride. In an embodiment, the insulating layer 1840 can include a single insulating film of silicon nitride. In another embodiment, the insulating layer 1840 can include a dielectric film, an etch-stop film, and a passivating film, where the etch stop-film has a composition different as compared to the dielectric and passivating films. In a particular embodiment, the dielectric and passivating films can include silicon nitride, and the etch-stop film can include aluminum oxide or an oxide of a transition metal. A different number or different set of compositions can be used for the films within the insulating layer 1840. The insulating layer 1840 can have a thickness in a range from 5 nm to 500 nm.

The insulating layer 1840 is patterned to define contact openings 1842 and 1846 and that expose portions barrier layer 1826. Some or all of the barrier layer 1826 may also be removed. As illustrated in FIG. 18, none or very little of the barrier layer 1826 is removed within the contact openings. The surface of the barrier layer 1826 or, if exposed, the channel layer 1824 along the bottom of the contact openings 1842 is along the (0002) crystal plane. The drain and source electrodes 1862 and 1866 are particular embodiments of contact structures that can include the materials and be formed as previously described.

A gate contact opening 1844 can be formed in the insulating layer 1840, and a gate interconnect 1864 can be formed in within the gate contact opening 1844 as illustrated in FIG. 18. The gate interconnect 1864 can include a conductive layer that may be the same or different from the conductive layer used for the drain and source electrodes 1862 and 1866. The number and composition of the films within the conductive layer for the gate interconnect 1864 can depend on the needs or desires for a particular application. After reading this specification, skilled artisans will be able to determine the composition of the conductive layer for the gate interconnect 1864 that is tailored to their devices. The conductive layer can have a thickness a range from 50 nm to 900 nm. In another embodiment, the conductive layer may be thinner or thicker than described in the preceding range. The conductive layer is patterned to form the gate interconnect 1864.

One or more interconnect levels and a passivation layer may be formed over the workpiece. Each interconnect level can include an interlevel dielectric layer and interconnects. A conductive layer can be used at each interconnect level. The conductive layer may be the same or different from the other conductive layers described earlier in this specification. After forming the interconnect levels and the passivation layer, an anneal may be performed. Performance of the previously described anneal may be deferred until this time, or an anneal separate from the anneal previously described may be performed. If a separate anneal is performed, it may be performed using the same or different parameters as the anneal previously described. A substantially completed electronic device has been formed.

Embodiments as described herein can help to reduce contact resistance. The techniques previously described allow crystals within a contact structure to have surfaces along a crystal plane that are aligned to a surface along a crystal plane for an underlying layer that contacts the contact structure. Conventional techniques used in depositing a conductive layer are performed to deposit the conductive layer as quickly as possible when keeping particles and non-uniformity acceptably low. A cleaning operation can be performed to ensure substantially all oxide and other contamination is removed before depositing any films within the conductive layer.

The thickness of a bulk conductive film can be selected so that a particular phase, such as an Al phase, contacts the underlying layer, even if a contacting film is deposited before the bulk conductive film is deposited. A reaction between materials in the bulk conductive film itself or the bulk conductive film and either or both of a contacting film and a capping film can react and form a separate phase, in addition to a principal phase, such as an Al-containing phase, within the bulk conductive film. Although not required in all embodiments, both the principal and separate phases can contact the surface of the underlying layer. The lowest contact resistance can occur with at least some of both phases contacting the underlying layer.

The order of the process used to form the contact structure can be tailored for a particular embodiment. For example, an anneal can be formed before or after patterning a conductive layer to define the shape of the contact structure. The anneal may be performed after patterning and before forming any additional interconnect level. In another embodiment, the anneal may be deferred until after forming a last interconnect level. Thus, after reading this specification, skilled artisan will be able to determine a particular order of process operations for a particular application. No additional deposition, anneal, or masking steps are required.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device can include a semiconductor layer and a contact structure forming an ohmic contact with the semiconductor layer. The contact structure can include a first phase and a second phase different from the first phase, wherein the first phase includes Al, the second phase includes the metal, and the first phase contacts the semiconductor layer.

Embodiment 2

The electronic device of Embodiment 1, wherein an interface between the semiconductor layer and the contact structure is free of an oxide.

Embodiment 3

The electronic device of Embodiment 1, wherein the second phase includes $Al_3Me$, $Me_2AlN$, MeN, or a combination thereof, wherein Me is the metal.

Embodiment 4

The electronic device of Embodiment 3, wherein the metal includes Ti, Zr, Hf, or Ta.

Embodiment 5

The electronic device of Embodiment 3, wherein the contact structure includes a first film in contact with the semiconductor layer, and a ratio of Al to $Al_3Me$ in the first film is at least 35%.

Embodiment 6

The electronic device of Embodiment 1, wherein the contact structure includes a first film in contact with the semiconductor layer and including the first and second phases; and a capping film overlying the first film.

Embodiment 7

The electronic device of Embodiment 6, wherein the first phase contacts a III-N material within the semiconductor layer.

Embodiment 8

The electronic device of Embodiment 1, the contact structure contacts the semiconductor layer within a contact opening, and along a surface of the semiconductor layer within the contact opening, at least 1% of the surface of the semiconductor layer is in contact with the first phase of the conductive structure.

Embodiment 9

The electronic device of Embodiment 1, wherein the semiconductor layer includes $In_aAl_bGa_cN$ where a+b+c=1, or a double heterostructure including a combination of different III-N compounds.

Embodiment 10

The electronic device of Embodiment 1, wherein the electronic device includes a high electron mobility transistor that includes the semiconductor layer and the contact structure.

Embodiment 11

The electronic device of Embodiment 1, wherein the electronic device has a plurality of contact structures having the same construction and an average contact resistance of at most 0.5 ohm*mm.

Embodiment 12

The electronic device of Embodiment 1, wherein:
the semiconductor layer includes $Al_{(1-x)}Ga_xN$ where $0 \leq x \leq 0.3$,
the second phase contacts the semiconductor layer and includes $Al_3Me$, wherein Me includes Ti, Zr, Hf, or Ta,
the contact structure includes a first film in contact with the semiconductor layer, and a ratio of Al to $Al_3Me$ in the first film is at least 35%,
the contact structure includes:
  a first film in contact with the semiconductor layer and including the first and second phases; and
  a capping film overlying the first film, and
the electronic device includes a high electron mobility transistor that includes the semiconductor layer and the contact structure.

Embodiment 13

An electronic device can include a monocrystalline layer having a surface along a crystal plane; and a contact structure forming an ohmic contact with the monocrystalline layer. The contact structure can include a polycrystalline material including first crystals having first surfaces that contact the surface of the monocrystalline layer, and a lattice mismatch between the surface of the monocrystalline layer and the first surfaces of the first crystals can be at most 20%.

Embodiment 14

The electronic device of Embodiment 13, wherein the monocrystalline layer includes a III-N material.

Embodiment 15

The electronic device of Embodiment 14, wherein the III-N material has a hexagonal lattice structure, the surface of the monocrystalline layer is along a (0002) crystal plane, the first crystals have a cubic lattice structure, and the surfaces of the crystals are along a (111) crystal plane.

Embodiment 16

The electronic device of Embodiment 13, wherein the polycrystalline material includes second crystals having second surfaces along a different crystal plane as compared to the first surfaces of the first crystals.

Embodiment 17

The electronic device of Embodiment 13, wherein the electronic device includes a high electron mobility transistor that includes the monocrystalline layer and the contact structure.

Embodiment 18

The electronic device of Embodiment 13, wherein:
the monocrystalline layer includes $Al_{(1-x)}Ga_xN$ where $0 \leq x \leq 0.3$ and the surface is along a (0002) crystal plane,
the conductive structure includes a film having an Al phase and an $Al_3Me$ phase, wherein Me includes Ti, Zr, Hf, or Ta,
the Al phase includes the first crystals and second crystals, wherein the first surfaces of the first crystals are along a (111) crystal plane, and second surfaces of the second crystals are along a (200) crystal plane,
the film has ratio of Al to $Al_3Me$ of at least 35%,
the contact structure includes:
  a first film in contact with the monocrystalline layer and including the first and second phases; and
  a capping film overlying the first film, and
the electronic device includes a high electron mobility transistor that includes the monocrystalline layer and the contact structure.

Embodiment 19

A process of forming an electronic device including: cleaning a surface of a semiconductor layer, wherein the surface is along a crystal plane; forming a contact structure that includes Al and a metal; and annealing the semiconductor layer and the contact structure, wherein after the anneal:
the contact structure includes a first phase and a second phase different from the first phase,
the first phase includes Al,
the second phase includes the metal, and
the first phase contacts the surface of the semiconductor layer.

Embodiment 20

The process of Embodiment 19, wherein forming the contact structure includes:
  forming a metal-containing film, wherein:
    the metal-containing is polycrystalline and includes first crystals having an epitaxial or fiber texture aligned to the surface of the semiconductor layer, and
    a lattice mismatch between the surface of the semiconductor layer and surfaces of the first crystals is at most 20%; and
  forming an Al-containing film over a surface of the metal-containing film, wherein as formed:
    the Al-containing film is spaced apart from the semiconductor layer by at least the metal-containing film,
    the Al-containing film includes at least 90 atomic % Al,
    the Al-containing film is polycrystalline and includes second crystals having an epitaxial or fiber texture aligned to the surface of the metal-containing film,
    the lattice mismatch between the surface of the semiconductor layer and surfaces of the second crystals is at most 20%.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
  a semiconductor layer, wherein:
    the semiconductor layer is a monocrystalline layer including a III-N material having a hexagonal lattice structure, and
    the monocrystalline layer has a surface along a (0002) crystal plane; and
  a contact structure forming an ohmic contact with the semiconductor layer, wherein the contact structure includes a first phase and a second phase different from the first phase, wherein:
    the first phase includes Al,
    the second phase includes a metal,
    the first phase includes first crystals having first surfaces that contact the surface of the monocrystalline layer, and
    the first crystals have a cubic lattice structure, and the first surfaces of the crystals are along a (111) crystal plane.

2. The electronic device of claim 1, wherein an interface between the semiconductor layer and the contact structure is free of an oxide.

3. The electronic device of claim 1, wherein the second phase includes $Al_3Me$, $Me_2AlN$, MeN, or a combination thereof, wherein Me is the metal.

4. The electronic device of claim 3, wherein the metal includes Ti, Zr, Hf, or Ta.

5. The electronic device of claim 3, wherein the contact structure includes a first film in contact with the semiconductor layer, and $Al_{rel}$ % is at least 80%, wherein:
  $Al_{rel}\% = Al_{free}/(Al_{total}+Me_{total})*100\%$,
  $Al_{free}$ % is the number of Al atoms/unit area in the first phase,
  $Al_{total}$ is the total number of Al atoms/unit area in the contact structure, and
  $Me_{total}$ is the total number of metal atoms/unit area in the contact structure.

6. The electronic device of claim 1, wherein the contact structure comprises:
  a first film in contact with the semiconductor layer and including the first and second phases; and
  a capping film overlying the first film.

7. The electronic device of claim 1, the contact structure contacts the semiconductor layer within a contact opening, and along a surface of the semiconductor layer within the contact opening, at least 1% of the surface of the semiconductor layer is in contact with the first phase of the conductive structure.

8. The electronic device of claim 1, wherein the semiconductor layer includes $In_aAl_bGa_cN$ where a+b+c=1, or a double heterostructure including a combination of different III-N compounds.

9. The electronic device of claim 1, wherein the electronic device includes a high electron mobility transistor that includes the semiconductor layer and the contact structure.

10. The electronic device of claim 1, wherein the electronic device has a plurality of contact structures having the same construction and an average contact resistance of at most 0.5 ohm*mm.

11. The electronic device of claim 1, wherein:
  the semiconductor layer includes $Al_{(1-x)}Ga_xN$ where $0<x\leq0.3$,
  the second phase contacts the semiconductor layer and includes $Al_3Me$, wherein Me includes Ti, Zr, Hf, or Ta,
  the contact structure includes a first film in contact with the semiconductor layer,
  $Al_{rel}$ % is at least 80%, wherein:
    $Al_{rel}\% = Al_{free}/(Al_{total}+Me_{total})*100\%$,
    $Al_{free}$ % is the number of Al atoms/unit area in the first phase, Al$_{total}$ is the total number of Al atoms/unit area in the contact structure, and Me$_{total}$ is the total number of metal atoms/unit area in the contact structure the contact structure comprises:
  a first film in contact with the semiconductor layer and including the first and second phases; and
  a capping film overlying the first film, and
the electronic device includes a high electron mobility transistor that includes the semiconductor layer and the contact structure.

12. An electronic device comprising:
a semiconductor layer, wherein the semiconductor layer is a monocrystalline layer having a surface along a crystal plane; and
a contact structure forming an ohmic contact with the semiconductor layer, wherein the contact structure includes a first phase and a second phase different from the first phase, wherein:
  the first phase includes Al,
  the second phase includes a metal,
  the first phase of the contact structure includes first crystals having first surfaces that contact the surface of the monocrystalline layer, and
  a lattice mismatch between the surface of the monocrystalline layer and the first surfaces of the first crystals is at most 20%.

13. The electronic device of claim 12, wherein the monocrystalline layer includes a III-N material.

14. The electronic device of claim 13, wherein:
the III-N material has a hexagonal lattice structure, the surface of the monocrystalline layer is along a (0002) crystal plane, the first crystals have a cubic lattice structure, and the first surfaces of the crystals are along a (111) crystal plane.

15. The electronic device of claim 12, wherein the first phase of the contact structure includes second crystals having second surfaces along a different crystal plane as compared to the first surfaces of the first crystals.

16. The electronic device of claim 12, wherein the electronic device includes a high electron mobility transistor that includes the monocrystalline layer and the contact structure.

17. The electronic device of claim 12, wherein:
the monocrystalline layer includes Al$_{(1-x)}$Ga$_x$N where $0 < x \leq 0.3$ and the surface is along a (0002) crystal plane,
the conductive structure includes a film having an Al phase and an Al$_3$Me phase, wherein Me includes Ti, Zr, Hf, or Ta,
the Al phase includes the first crystals and second crystals, wherein the first surfaces of the first crystals are along a (111) crystal plane, and second surfaces of the second crystals are along a (200) crystal plane,
Al$_{rel}$ % is at least 80%, wherein:
  Al$_{rel}$ % = Al$_{free}$/(Al$_{total}$+Me$_{total}$)*100%,
  Al$_{free}$ % is the number of Al atoms/unit area in the first phase,
  Al$_{total}$ is the total number of Al atoms/unit area in the contact structure, and
  Me$_{total}$ is the total number of metal atoms/unit area in the contact structure,
the contact structure comprises:
  a first film in contact with the monocrystalline layer and including the first and second phases; and
  a capping film overlying the first film,
the electronic device includes a high electron mobility transistor that includes the monocrystalline layer and the contact structure.

18. The electronic device of claim 1, wherein the first phase includes at least 90 atomic % Al, and the second phase includes Al$_3$Me, Me$_2$AlN, MeN, or a combination thereof, wherein Me is Ti, Zr, Hf, or Ta.

19. An electronic device comprising:
a semiconductor layer, and
a contact structure including a first film in contact with the semiconductor layer and forming an ohmic contact with the semiconductor layer, wherein:
  the first film includes a first phase and a second phase different from the first phase, wherein:
  the first phase includes Al and contacts the semiconductor layer,
  the second phase includes a metal, and
  Al$_{rel}$ % is at least 80%, wherein:
    Al$_{rel}$ % = Al$_{free}$/(Al$_{total}$+Me$_{total}$)*100%,
    Al$_{free}$ % is the number of Al atoms/unit area in the first phase,
    Al$_{total}$ is the total number of Al atoms/unit area in the contact structure, and
    Me$_{total}$ is the total number of metal atoms/unit area in the contact structure.

20. The electronic device of claim 19, wherein the semiconductor layer includes In$_a$Al$_b$Ga$_c$N, where a+b+c=1.

* * * * *